(12) United States Patent
Matsuda

(10) Patent No.: US 9,299,831 B2
(45) Date of Patent: Mar. 29, 2016

(54) FIELD EFFECT TRANSISTOR AND SEMICONDUCTOR DEVICE

(71) Applicant: ASAHI KASEI MICRODEVICES CORPORATION, Tokyo (JP)

(72) Inventor: Jun-ichi Matsuda, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/432,590

(22) PCT Filed: Oct. 11, 2013

(86) PCT No.: PCT/JP2013/006103
§ 371 (c)(1),
(2) Date: Mar. 31, 2015

(87) PCT Pub. No.: WO2014/061254
PCT Pub. Date: Apr. 24, 2014

(65) Prior Publication Data
US 2015/0295081 A1    Oct. 15, 2015

(30) Foreign Application Priority Data

Oct. 16, 2012    (JP) ................................ 2012-228982
Jun. 28, 2013    (JP) ................................ 2013-136641

(51) Int. Cl.
*H01L 29/76*    (2006.01)
*H01L 29/78*    (2006.01)
(Continued)

(52) U.S. Cl.
CPC .......... *H01L 29/7816* (2013.01); *H01L 29/063* (2013.01); *H01L 29/0634* (2013.01);
(Continued)

(58) Field of Classification Search
CPC ............ H01L 21/762; H01L 21/02576; H01L 21/02579; H01L 21/0214; H01L 21/041; H01L 21/3141; H01L 21/4242; H01L 21/102129; H01L 21/02614; H01L 27/3248; H01L 27/1104; H01L 29/76; H01L 29/7816; H01L 29/66045; H01L 29/66613; H01L 29/66681; H01L 29/435

USPC ......... 257/213, 192, 210, 288, 285, 396, 350, 257/359, 382, 387, 388, 391, 392, 509, 780, 257/E21.006, E21.023, E21.045, E21.051, 257/E21.058, E21.061, E21.077, E21.135, 257/E21.144, E21.17, E21.231, E21.267, 257/E21.278, E21.396, E21.421, E21.435

See application file for complete search history.

(56) References Cited

U.S. PATENT DOCUMENTS 537,843 A * 4/1895 Williams ............... B65D 49/06
215/22
5,374,843 A   12/1994 Williams et al.
(Continued)

FOREIGN PATENT DOCUMENTS

JP    H05-259444 A    10/1993
JP    2000-252465 A    9/2000
(Continued)

OTHER PUBLICATIONS

Ko et al., BD18OLV-0.18μm BCD Technology with Best-in-Class LDMOS from 7V to 30V, Proceedings of The 22th International Symposium on Power Semiconductor Devices & ICs, Hiroshima, pp. 71-74, 2010.

(Continued)

*Primary Examiner* — David Nhu
(74) *Attorney, Agent, or Firm* — Morgan, Lewis & Bockius LLP

(57) ABSTRACT

A field effect transistor and a semiconductor device are provided which enable a drain breakdown voltage in an off state and a drain breakdown voltage in an on state to be improved respectively. There are provided therein a field oxide film disposed on an N-type drift region positioned between a channel region of a silicon substrate and an N-type drain, an N-type drift layer disposed beneath the drift region of the silicon substrate and the drain, and an embedded layer higher in P-type impurity concentration than the silicon substrate. The embedded layer is disposed beneath the drift layer except for below at least a portion of the drain in the silicon substrate.

12 Claims, 28 Drawing Sheets

(51) Int. Cl.
  *H01L 29/06* (2006.01)
  *H01L 29/08* (2006.01)
  *H01L 29/10* (2006.01)
  *H01L 29/66* (2006.01)

(52) U.S. Cl.
  CPC ........ *H01L29/0653* (2013.01); *H01L 29/0847* (2013.01); *H01L 29/0878* (2013.01); *H01L 29/1083* (2013.01); *H01L 29/66659* (2013.01); *H01L 29/7835* (2013.01); *H01L 29/0692* (2013.01); *H01L 29/0696* (2013.01); *H01L 29/1045* (2013.01)

(56) References Cited

U.S. PATENT DOCUMENTS

| | | | |
|---|---|---|---|
| 6,404,009 | B1 | 6/2002 | Mori |
| 6,573,534 | B1* | 6/2003 | Kumar ................ H01L 29/1608 257/77 |
| 6,599,782 | B1 | 7/2003 | Kikuchi et al. |
| 7,968,941 | B2* | 6/2011 | Fujita ................ H01L 29/0696 257/335 |
| 2009/0242981 | A1 | 10/2009 | Fujita et al. |
| 2009/0256199 | A1 | 10/2009 | Denison et al. |
| 2009/0257249 | A1 | 10/2009 | Kaneko |
| 2011/0127602 | A1 | 6/2011 | Mallikarjunaswamy |
| 2012/0094457 | A1 | 4/2012 | Gabrys |

FOREIGN PATENT DOCUMENTS

| | | |
|---|---|---|
| JP | 2005-93456 A | 4/2005 |
| JP | 2009-239111 A | 10/2009 |
| JP | 2009-259972 A | 11/2009 |
| JP | 2011-049457 A | 3/2011 |
| TW | 495981 B | 7/2002 |
| TW | 201133856 A1 | 10/2011 |
| TW | 201216378 A1 | 4/2012 |

OTHER PUBLICATIONS

International Search Report dated Jan. 14, 2015, for International application No. PCT/JP2013/006103.
International Preliminary Report on Patentability dated Apr. 21, 2015, for the corresponding International application No. PCT/JP2013/006103.

* cited by examiner

FIELD EFFECT TRANSISTOR AND SEMICONDUCTOR DEVICE

The present application is a national stage application of PCT/JP2013/006103, filed Oct. 11, 2013, which claims priority to JP 2012-228982, filed Oct. 16, 2012 and JP 2013-136641, filed Jun. 28, 2013, all of which are incorporated by reference.

TECHNICAL FIELD

The present invention relates to a field effect transistor and a semiconductor device, and particularly to a field effect transistor and a semiconductor device which enable a drain breakdown voltage in an off state and a drain breakdown voltage in anon state to be improved respectively.

BACKGROUND ART

An LDMOS (Laterally Diffused MOS) transistor having a structure in which an impurity layer near a drain is diffused laterally has heretofore been known. Studies to achieve an increase in breakdown voltage of the LDMOS transistor and a reduction in on-resistance thereof have been done.

There has been disclosed in, for example, a Non-Patent Literature 1, a structure of an LDMOS transistor 850 in which a P− layer 803 is disposed below an N− drift layer (hereinafter, an N− layer) 801 as illustrated in FIG. 30. According to this structure, a parasitic capacitance is generated between the P− layer 803 and the N− layer 801 and an electric charge is accumulated in the parasitic capacitance. Therefore, a depletion layer is formed in the N− layer 801. Thus, it is possible to relax a surface electric field of the N− layer 801 (i.e., obtain Reduced Surface Field: RESURF effect) and increase a drain breakdown voltage (i.e., OFF-BVdss) in an off state.

CITATION LIST

Non-Patent Literature

NPL 1: Kwang-Young Ko et al., "BD180LV-0.18 μm BCD Technology with Best-in-Class LDMOS from 7V to 30V," Proceedings of The 22th International Symposium on Power Semiconductor Devices & ICs, Hiroshima, pp. 71-74, 2010.

SUMMARY OF INVENTION

Technical Problem

In the structure illustrated in FIG. 30, the RESURF effect can be obtained by increasing the impurity concentration of the P− layer 803. However, if the impurity concentration of the P− layer 803 is excessively increased, the N− layer 801 is widely depleted from the side of the P− layer 803. Thus, a problem has arisen in that in the LDMOS transistor in an on state, a current path in the N− layer 801 is pushed to a semiconductor surface region so that a conductive electron current density is increased and a net charge in the depletion layer of the N− layer 801 changes from plus to minus, thereby making it easy to spread an effective channel to the drain 805 (i.e., a Kirk effect becomes easy to occur around the drain). There has been a problem in that since an electric field is concentrated on the end portion of the drain when the Kirk effect occurs around the drain, the drain breakdown voltage (i.e., ON-BVdss) in the on state is reduced.

Therefore, this invention has been made in view of such a situation and aims to provide a field effect transistor and a semiconductor device which enable a drain breakdown voltage in an off state and a drain breakdown voltage in an on state to be improved respectively.

Solution to Problem

In order to solve the above problems, a field effect transistor according to one aspect of the present invention is provided which is a field effect transistor formed in a semiconductor substrate.

The field effect transistor is characterized by including a drift region of a first conductivity type disposed between a region to be a channel of the semiconductor substrate and a drain of a first conductivity type, a field oxide film disposed on the drift region, and a first impurity diffusion layer of a second conductivity type disposed beneath the drift region of the semiconductor substrate, and in that the drift region has a first drift layer of a first conductivity type, and a second drift layer disposed on the first drift layer having higher first conductivity type impurity concentration than the corresponding first drift layer.

Also, in the above field effect transistor, it may be characterized by further including a second impurity diffusion layer disposed beneath the drift region, having higher second conductivity type impurity concentration than the first impurity diffusion layer and in that the drift region further has a third drift layer disposed on the second impurity diffusion layer, having higher in first conductivity type impurity concentration than the second drift layer, and the third drift layer and the second impurity diffusion layer are positioned directly below the field oxide film.

Further, in the above field effect transistor, it may be characterized in that the third drift layer is in contact with the field oxide film.

Furthermore, in the above field effect transistor, it may be characterized in that the second drift layer extends from below an end portion of the field oxide film to the region side to be the channel.

Further, the above field effect transistor is a field effect transistor formed in a semiconductor substrate. The field effect transistor may be characterized by including a drift region of a first conductivity type disposed between a region to be a channel of the semiconductor substrate and a drain of a first conductivity type, a field oxide film disposed on the drift region, and a second impurity diffusion layer of a second conductivity type disposed beneath the drift region of the semiconductor substrate, and in that the drift region has a first drift layer of a first conductivity type, and a third drift layer disposed on the second impurity diffusion layer, having a higher first conductivity type impurity concentration than the first drift layer, and the third drift layer and the second impurity diffusion layer are positioned directly below the field oxide film.

A field effect transistor according to another aspect of the present invention is characterized by including a source and a drain formed in a semiconductor substrate, a field oxide film formed on the semiconductor substrate, a drift layer of a first conductivity type formed beneath the field oxide film, formed beneath the drain, and formed between the drain and a channel region, a first region being below the drain and in contact with the bottom of the drift layer and comprised of a second conductivity type different from the first conductivity type, and a second region comprised of a second conductivity type, which is in contact with the bottom of the drift layer except in the first region, and in that a second conductivity type impurity concentration of the first region is lower than a second conductivity type impurity concentration of the second region.

Also, in the above field effect transistor, it may be characterized in that the drift layer has a first drift layer, and a second drift layer disposed on the first drift layer, having higher first conductivity type impurity concentration than the first drift layer.

Further, in the above field effect transistor, it may be characterized in that the drift layer further includes a third drift layer disposed on the first drift layer, having higher first conductivity type impurity concentration than the second drift layer, and the third drift layer is disposed beneath the field oxide film.

Furthermore, in the above field effect transistor, it may be characterized in that the second drift layer extends from below an end portion of the field oxide film to the region side to be the channel.

Still further, in the above field effect transistor, it may be characterized in that the second conductivity type impurity concentration of the first region is the same impurity concentration as the semiconductor substrate.

A field effect transistor according to a further aspect of the present invention is characterized by including a source and a drain formed in a semiconductor substrate, a field oxide film formed on the semiconductor substrate, a body layer of a second conductivity type formed from beneath the source to a channel region, a drift layer of a first conductivity type formed beneath the field oxide film, formed beneath the drain, and formed between the drain and the channel region, and an impurity diffusion layer of a second conductivity type disposed below the field oxide film in the drift layer except for below at least a part of the drain.

Also, in the above field effect transistor, it may be characterized in that the drift layer is formed so as to further surround the body layer.

Further, in the above field effect transistor, it may be characterized by further including a second impurity diffusion layer of a second conductivity type disposed below at least a part of the drain and in that a second conductivity type impurity concentration of the second impurity diffusion layer is lower than a second conductivity type impurity concentration of the impurity diffusion layer.

Furthermore, in the above field effect transistor, it may be characterized by further including a second drift layer of a first conductivity type disposed between the drain and the impurity diffusion layer and in that a first conductivity type impurity concentration of the second drift layer is higher than a first conductivity type impurity concentration of the drift layer.

A semiconductor device according to one aspect of the present invention is characterized by being equipped with the above field effect transistor.

Advantageous Effects of Invention

According to one aspect of the present invention, a field effect transistor and a semiconductor device can be provided which enable a drain breakdown voltage in an off state and a drain breakdown voltage in an on state to be improved respectively.

DESCRIPTION OF EMBODIMENTS

Figure 1:
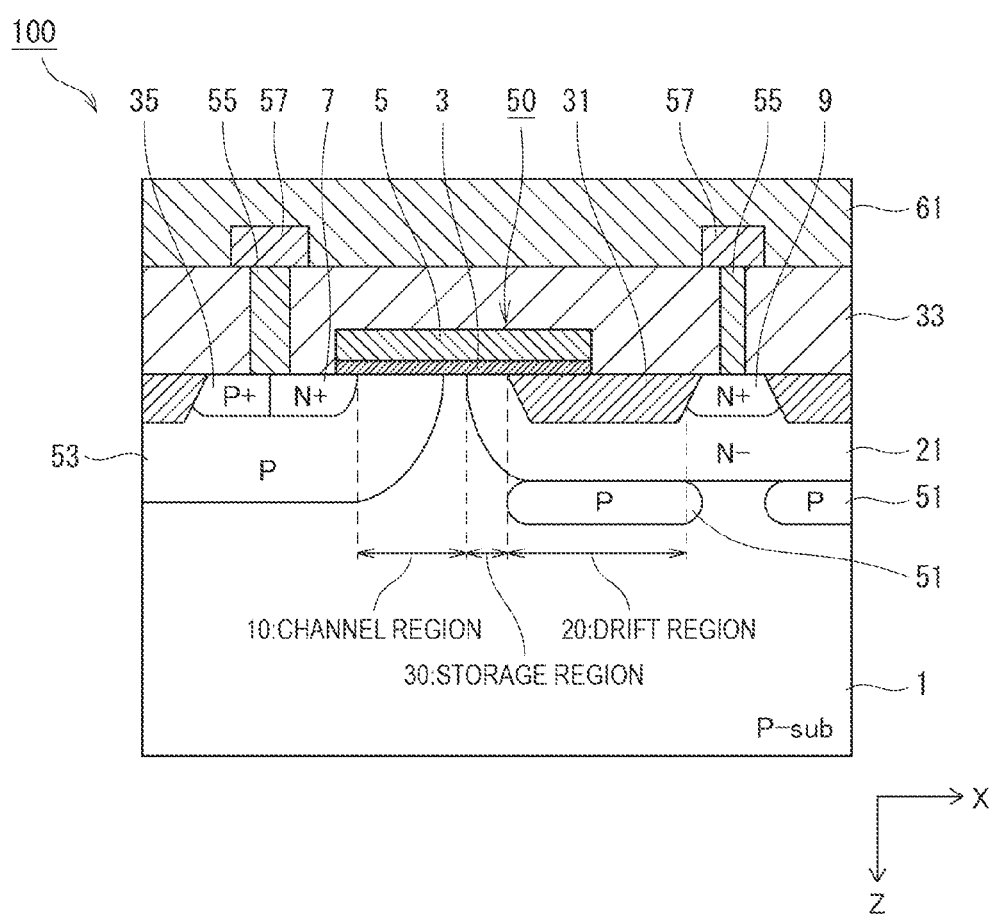
FIG. 1 is a cross-sectional view illustrating a configuration example of a semiconductor device 100 according to a first embodiment.

A field effect transistor according to an embodiment (hereinafter, the present embodiment) of the present invention is characterized by including a source and a drain formed in a semiconductor substrate, a field oxide film formed on the semiconductor substrate, a drift layer of a first conductivity type formed beneath the field oxide film, formed beneath the drain, and formed between the drain and a channel region, a first region being below the drain and in contact with the bottom of the drift layer and comprised of a second conductivity type different from the first conductivity type, and a second region being in contact with the bottom of the drift layer except in the first region and in that a second conductivity type impurity concentration of the first region is lower than a second conductivity type impurity concentration of the second region.

According to the present embodiment, the second region (second conductivity type impurity diffusion layer) is disposed beneath the field oxide film (beneath first conductivity type drift region). A PN junction is formed between the drift region and the impurity diffusion layer. Thus, in the field effect transistor in an off state, the drift region can be efficiently depleted. When a reverse bias is applied between the source and drain in a state in which the source and the semiconductor substrate are electrically connected, it becomes easy to fully deplete the drift region at a stage in which the reverse bias is small. Accordingly, it is possible to relax a surface electric field of the drift region (i.e., obtain a RESURF effect). It is possible to improve a drain breakdown voltage (i.e., OFF-BVdss) in the off state.

Also, the second conductivity type impurity concentration of the first region is lower than the second conductivity type impurity concentration of the second region. The impurity diffusion layer preferably does not exist below at least a part (i.e., part or all) of the drain. Thus, a depletion layer can be widened between the drift layer and the semiconductor substrate beneath the drain, and a potential gradient in the drift layer can be relieved (i.e., the drift layer can be brought into a low electric field thereinside). Accordingly, the attraction of carriers into the drain side can be weakened. When the field effect transistor is being turned on, a current density in the drift layer can be reduced. Thus, it is possible to suppress the polarity of a net charge in the depletion layer of the drift layer from being inverted due to the influence of a current and suppress an effective channel from being spread to the drain (i.e., the generation of a Kirk effect around the drain).

Further, since it is possible to reduce impact ionization around the drain by the Kirk effect, a Kink phenomenon (sudden increase in saturation drain current) in the vicinity of the drain can be relieved. Thus, it is possible to improve a drain breakdown voltage (BVdss-ON) in the on state.

The field effect transistor according to the present embodiment is a field effect transistor formed in a semiconductor substrate and is characterized by including a drift region of a first conductivity type disposed between a region to be a channel of a semiconductor substrate and a drain of a first conductivity type, a field oxide film disposed on the drift region, and a first impurity diffusion layer of a second conductivity type disposed beneath the drift region of the semiconductor substrate and in that the drift region has a first drift layer of a first conductivity type, and a second drift layer disposed on the first drift layer, having higher first conductivity type impurity concentration than the first drift layer.

According to the present embodiment, the second conductivity type first impurity diffusion layer is disposed beneath the first conductivity type drift region. A PN junction is formed between the first drift layer and the first impurity diffusion layer. Thus, in the field effect transistor in the off state, the drift region can be efficiently depleted. When a reverse bias is applied between the source and drain in a state in which the source and the semiconductor substrate are electrically connected, it becomes easy to fully deplete the drift region at a stage in which the reverse bias is low. Thus, it is possible to relieve a surface electric field of the drift region (i.e., obtain a RESURF effect) and maintain high a drain breakdown voltage (i.e., OFF-BVdss) in the off state.

Also, since the RESURF effect can be obtained, it is possible to enhance an impurity concentration near the surface of the drift region as in the second drift layer. It is thus possible to reduce an on-resistance while maintaining OFF-BVdss high.

Further, the second drift layer having a higher first conductivity type impurity concentration than the first drift layer is disposed on the first drift layer. Thus, when the field effect transistor is being turned on, it is possible to suppress the polarity of a net charge in the depletion layer of the drift region from being inverted due to the influence of a drain voltage and the first impurity diffusion layer and suppress an effective channel from being spread to the drain (i.e., the generation of a Kirk effect around the drain). Thus, since an electric field can be prevented from being concentrated on an end portion of the drain, a drain breakdown voltage (i.e., ON-BVdss) in the on state can be maintained high.

Respective embodiments of the present invention will hereinafter be described using the drawings. It is to be noted that in the respective drawings described below, components having the same configuration are given the same reference numerals, and their repetitive description will be omitted.

First Embodiment (Structure)

FIG. 1 is a cross-sectional view illustrating a configuration example of a semiconductor device 100 according to the first embodiment of the present invention. As illustrated in FIG. 1, this semiconductor device 100 is provided with, for example, a P-type silicon substrate (P-sub) 1, an LDMOS transistor 50 of an N-channel type formed in the silicon substrate 1, an interlayer insulating film 33 which is disposed on the silicon substrate 1 and covers the LDMOS transistor 50, a contact electrode 55 which penetrates through the interlayer insulating film 33 and is connected to the LDMOS transistor 50, a wiring layer 57 disposed on the interlayer insulating film 33 and connected to the contact electrode 55, and a protective film 61 which is disposed on the interlayer insulating film. 33 and covers the wiring layer 57.

The LDMOS transistor 50 is provided with a gate insulating film 3 disposed on the silicon substrate 1, a gate electrode 5 disposed on the gate insulating film 3, an N-type source (N+ layer) 7 and drain (N+ layer) 9 disposed below on both sides of the gate electrode 5 of the silicon substrate 1, a field oxide film 31 disposed on an N-type drift region 20 of the silicon substrate 1, an N-type drift layer (N− layer) 21 disposed below the drift region 20 and the drain 9 of the silicon substrate 1, P-type embedded layers (P layer) 51 disposed below the drift layer 21 of the silicon substrate 1, a P-type body layer (P layer) 53 disposed in the silicon substrate 1, and a P-type pickup layer (P layer) 35. Here, the drift region 20 is a region located between a region (hereinafter, a channel region) 10 to be a channel of the silicon substrate 1 and the drain 9.

The gate insulating film 3 is, for example, a silicon oxide film obtained by thermal oxidation of the silicon substrate 1. The field oxide film 31 is a silicon oxide film formed by an STI (Shallow Trench Isolation) method. As illustrated in FIG. 1, the gate electrode 5 is provided over the field oxide film 31 from above the gate insulating film 3. Further, the source 7 and drain 9 respectively include an N-type impurity in a high concentration and are respectively exposed from below the field oxide film 31.

The N-type drift layer 21 is disposed beneath the drift region 20 and the drain 9 and has an upper portion being in contact with the field oxide film 31. That is, the N-type drift layer 21 is formed below the field oxide film 31 and formed between an under-layer of the drain 9 and the channel region. An N-type impurity concentration of the drift layer 21 is lower than the N-type impurity concentration at the source 7 and drain 9. Further, the drift layer 21 extends from below an end portion of the field oxide film 31 to the channel region 10 side in a channel length direction (e.g., X-axis direction) and constitutes a storage region 30. It is to be noted that the storage region is a region in which when a positive bias is applied to the gate electrode, majority carriers are attracted to the gate insulating film side and accumulated.

The P-type embedded layer 51 is disposed beneath the drift layer 21 and includes an upper portion in contact with the N-type drift layer 21. A P-type impurity concentration of the embedded layer 51 is higher than a P-type impurity concentration of the silicon substrate 1. Further, the embedded layer 51 is not disposed below at least a portion (i.e., part or all) of the drain 9 even if it is beneath the drift layer 21. That is, the embedded layer 51 is not intentionally placed below the drain 9. Here, the lower refers to the downward direction of a Z-axis direction in FIG. 1.

The P-type body layer 53 is disposed over the channel region 10 from beneath the source 7 of the silicon substrate 1. In the present embodiment, e.g., the body layer 53 constitutes at least a portion of the channel region 10. Further, the P-type pickup layer 35 is provided inside the body layer 53 and disposed on the side opposite to the side being in contact with the channel region of the source 7, for example. The P-type pickup layer 35 is electrically connected to the body layer 53 and the source 7. Both of the body layer 53 and the pickup layer 35 has a higher P-type impurity concentration than the silicon substrate 1. Further, for example, the pickup layer 35 has a higher P-type impurity concentration than the body layer 53. It is to be noted that the source 7 and the pickup layer 35 are electrically connected by the contact electrode 55 so as to straddle over these and set to the same potential (e.g., a ground potential).

(Manufacturing Method)

A manufacturing method of the semiconductor device 100 illustrated in FIG. 1 will next be described.

Figure 2A:
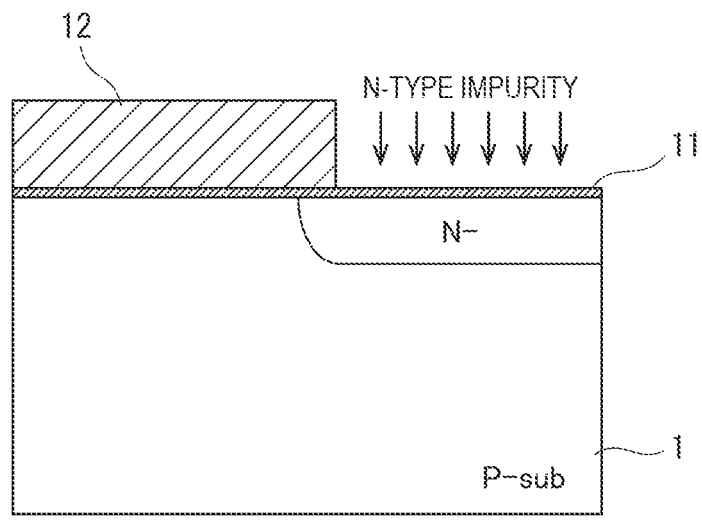
FIGS. 2A to 2C are cross-sectional views illustrating a manufacturing method of the semiconductor device 100 in a process order.

FIGS. 2A to 2C and FIGS. 3A to 3C are respectively cross-sectional views illustrating the manufacturing method of the semiconductor device 100 in a process order. As illustrated in FIG. 2A, a silicon substrate 1 is first prepared. Next, the surface of the silicon substrate 1 is thermally oxidized to form a silicon oxide film 11. Then, a resist pattern 12 is formed on the silicon oxide film 11 using a photolithography technique. This resist pattern 12 has a shape to open an upper part of a region for forming an N-type drift layer and cover regions other than it. Next, an N-type impurity such as phosphorus is ion-implanted in the silicon substrate 1 using this resist pattern 12 as a mask. After the ion implantation, the resist pattern 12 is removed from above the silicon substrate 1.

Figure 2B:
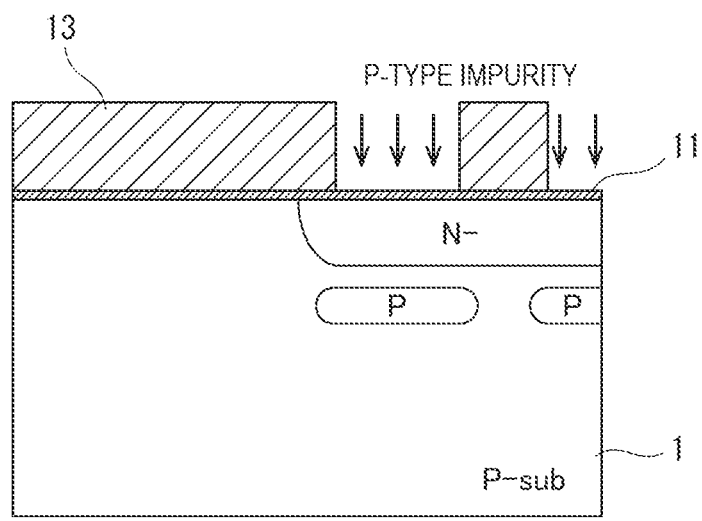
Figure 2C:
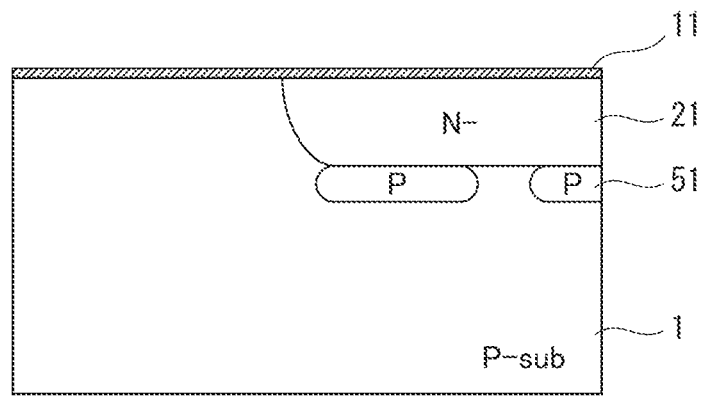

Next, as illustrated in FIG. 2B, a resist pattern 13 is formed on the silicon oxide film 11 using the photolithography technique. This resist pattern 13 has a shape to open an upper part of a region for forming a P-type embedded layer and cover regions other than it. Then, a P-type impurity such as boron is ion-implanted in the silicon substrate 1 using this resist pattern 13 as a mask. After the ion implantation, the resist pattern 13 is removed from above the silicon substrate 1. Thereafter, the silicon substrate 1 is heat-treated to diffuse the impurity in the silicon substrate 1. Thus, as illustrated in FIG. 2C, an N-type drift layer 21 and a P-type embedded layer 51 are respectively formed in the silicon substrate 1.

Figure 3A:
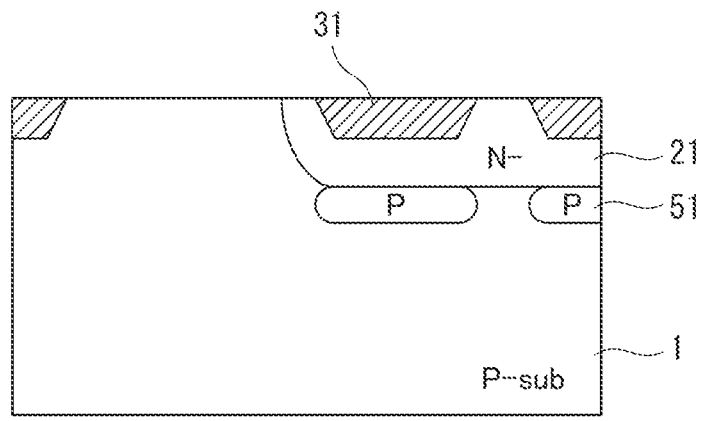
FIGS. 3A to 3C are cross-sectional views illustrating the manufacturing method of the semiconductor device 100 in a process order.

Next, as illustrated in FIG. 3A, a field oxide film 31 is formed in the silicon substrate 1 by, for example, an STI method. In the STI method, the silicon substrate 1 is cut by dry etching to form a trench (groove). A silicon oxide film is embedded in the trench to thereby form a field oxide film 31. It is to be noted that the silicon oxide film 11 is removed, for example, in the process of forming the field oxide film 31.

Figure 3B:
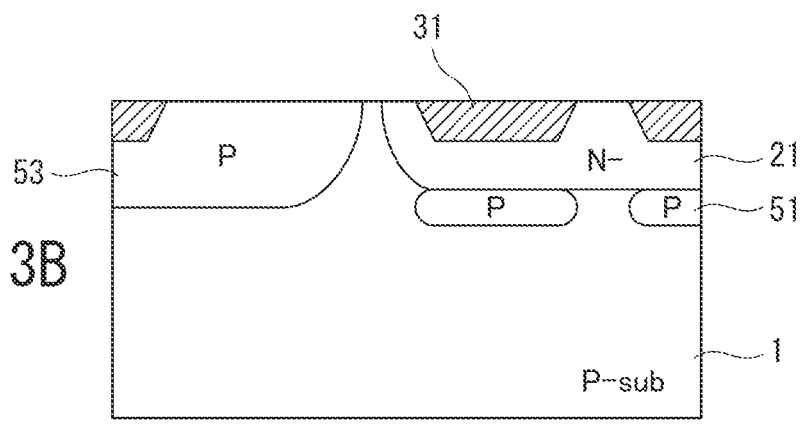

Next, a P-type impurity such as boron is selectively ion-implanted in the silicon substrate 1 using the photolithography technique and an ion implantation technique. Then, after an unillustrated resist pattern has been removed, the silicon substrate 1 is subjected to heat treatment. Thus, as illustrated in FIG. 3B, a P-type body layer 53 is formed in the silicon substrate 1.

Figure 3C:
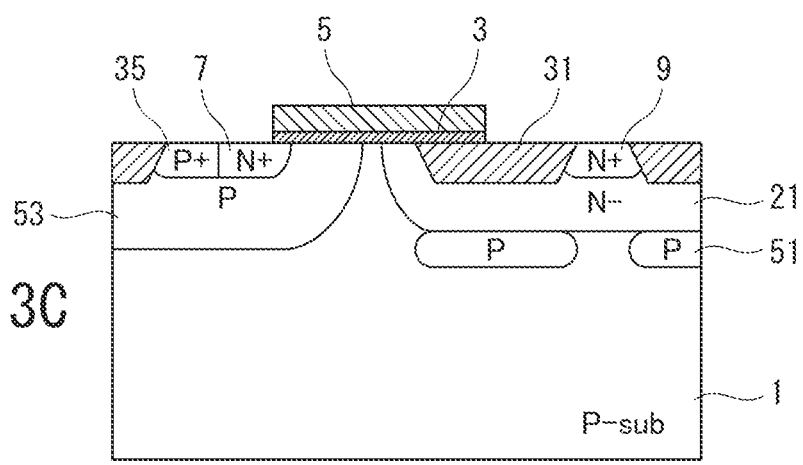

Next, as illustrated in FIG. 3C, the silicon substrate 1 is thermally oxidized to form a gate insulating film 3. Subsequently, a polysilicon film is formed on the gate insulating film 3 using, for example, an LPCVD method (low pressure chemical vapor deposition). Then, the polysilicon film is patterned using the photolithography technique and a dry etching technique. Thus, a gate electrode 5 made of the polysilicon film is formed on the gate insulating film 3. After the formation of the gate electrode 5, an unillustrated resist pattern is removed.

Next, an N-type impurity such as phosphorus or arsenic is ion-implanted in a region for forming a source and drain of the silicon substrate 1 using the photolithography technique and the ion implantation technique. After the ion implantation, a resist pattern is removed. Then, the silicon substrate 1 is subjected to heat treatment. Thus, as illustrated in FIG. 3C, the impurity is diffused in the silicon substrate 1 to form an N-type source 7 and drain 9.

Next, a P-type impurity such as boron is ion-implanted in a region for forming a pickup layer 35 of the silicon substrate 1 using the photolithography technique and the ion implantation technique. After the ion implantation, a resist pattern is removed. Then, the silicon substrate 1 is subjected to heat treatment. Thus, the impurity is diffused in the silicon substrate 1 to form the pickup layer 35.

Next, an interlayer insulating film 33 (refer to FIG. 1) is formed on the silicon substrate 1. The interlayer insulating film 60 is, for example, a silicon oxide film, and its formation is done by, for example, a CVD method. Then, a contact electrode 55 (refer to FIG. 1) is formed. Thereafter, a wiring layer 57 (refer to FIG. 1) is formed on the interlayer insulating film 60 and a protective film 61 is formed. The semiconductor device 100 illustrated in FIG. 1 is completed through the steps described above.

In the first embodiment, the silicon substrate 1 corresponds to the "semiconductor substrate" of the present invention, and the LDMOS transistor 50 corresponds to the "field effect transistor" of the present invention. Further, the field oxide film 31 corresponds to the "field oxide film" of the present invention, the N-drift layer 21 corresponds to the "drift layer" of the present invention, the embedded layer 51 corresponds to the "second region" of the present invention, and the same region as the silicon substrate 1 below the drain 9 and being in contact with the bottom of the drift layer 21 corresponds to the "first region" of the present invention. The N-type impurity concentration of the first region is the same impurity concentration as the silicon substrate 1. Further, the N-type corresponds to the "first conductivity type" of the present invention, and the P-type corresponds to the "second conductivity type" of the present invention.

Effects of First Embodiment

The first embodiment of the present invention brings about the following effects.

(1) The P-type embedded layer 51 is disposed beneath the N-type drift region 20, and a PN junction is formed between the drift region 20 and the embedded layer 51. Thus, in the LDMOS transistor in an off state, the drift region 20 can be depleted efficiently. When a reverse bias is applied between the source and drain in a state in which the source 7 and the silicon substrate 1 are electrically connected, it becomes easy to fully deplete the drift region 20 at a stage in which the reverse bias is small. Accordingly, it is possible to relax the surface electric field of the drift region 20 (i.e., obtain a RESURF effect). It is possible to improve a drain breakdown voltage (i.e., OFF-BVdss) in the off state. That is, the RESURF effect becomes more effective by the embedded layer 51 present beneath the drift region 20, thereby making it possible to improve OFF-BVdss.

(2) Further, the embedded layer 51 does not exist below at least a part (i.e., part or all) of the drain 9. Thus, the depletion layer can be widened between the drift layer 21 and the silicon substrate 1 beneath the drain 9, and a potential gradient in the drift layer 21 is relieved (i.e., the drift layer 21 is brought into a low electric field thereinside). This point will be further described with reference to the drawings.

Figure 4A:
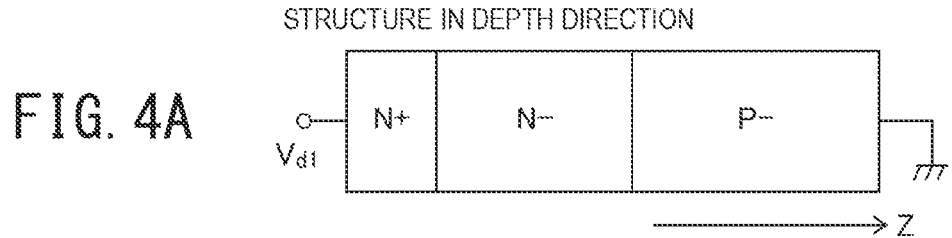
FIGS. 4A to 4C are conceptual views typically illustrating a structure and an electric field distribution or the like in a depth direction in an embodiment.
Figure 4B:
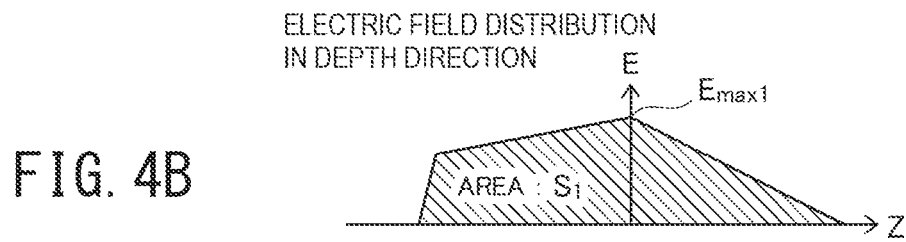
Figure 4C:
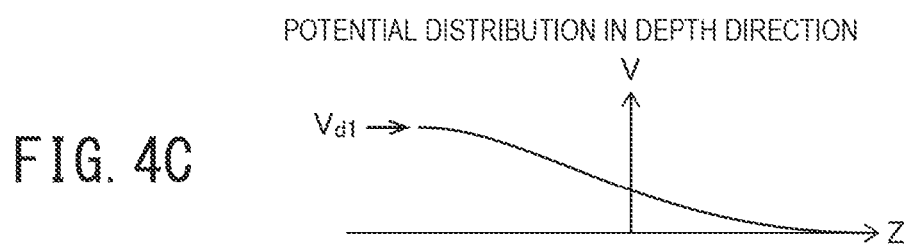
Figure 5A:
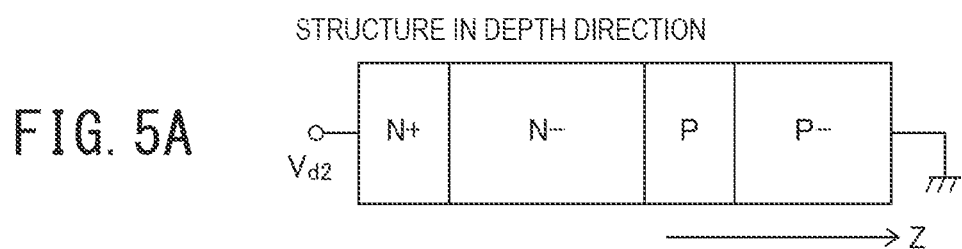
FIGS. 5A to 5C are conceptual views typically illustrating a structure and an electric field distribution or the like in a depth direction in a comparative form.
Figure 5B:
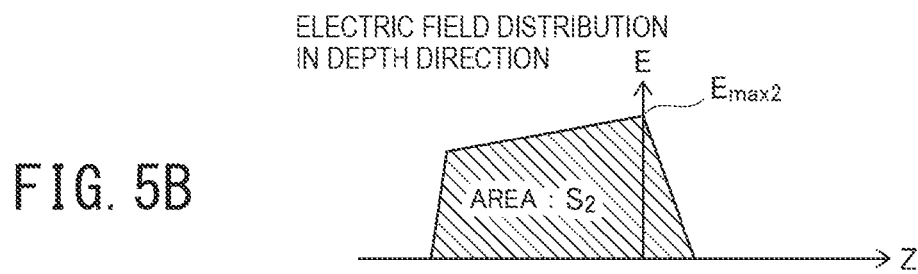
Figure 5C:
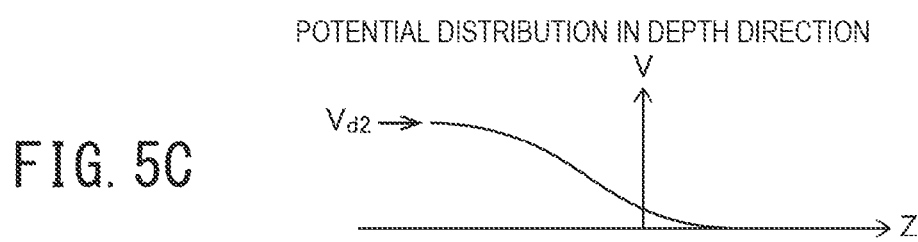

FIGS. 4A to 4C are conceptual views for the LDMOS transistor according to the embodiment of the present invention, typically illustrating a depth-direction (Z-axis direction) structure adjacent to the drain, an electric field distribution and a potential distribution. Further, FIGS. 5A to 5C are conceptual views for the LDMOS transistor according to the comparative form of the present invention, typically illustrating a depth-direction (Z-axis direction) structure adjacent to the drain, an electric field distribution and a potential distribution. In FIG. 4B and FIG. 5B, the horizontal axis indicates a depth direction (Z-axis direction), and the vertical axis indicates an electric field strength. Further, in FIG. 4C and FIG. 5C, the horizontal axis indicates a depth direction (Z-axis direction), and the vertical axis indicates a potential.

It is to be noted that a structural difference between the embodiment illustrated in FIGS. 4A to 4C and the comparative form illustrated in FIGS. 5A to 5C is only the presence or absence of an embedded layer (P) below the drain (N+), and otherwise, they are the same. Further, in FIGS. 4A to 4C and FIGS. 5A to 5C, assume a state in which drain voltages Vd1 and Vd2 (Vd1=Vd2) are respectively applied to the drain (N+), and the semiconductor substrate (P−) is connected to the ground potential.

As illustrated in FIG. 4A, in the embodiment, no embedded layer (P) is present below the drain (N+). Further, as illustrated in FIG. 5A, in the comparative form, the embedded layer (P) exists below the drain (N+). Thus, in the embodiment, the depletion layer can be widen between the drift layer (N−) and the semiconductor substrate (P−) as compared with the comparative form.

Therefore, as illustrated in FIG. 4B and FIG. 5B, for a peak electric field at a PN junction surface between the drift layer (N−) and the semiconductor substrate (P−), a peak electric field Emax1 in the embodiment can be made lower than a peak electric field Emax2 in the comparative form (i.e., S1=S2 and Emax1<Emax2 at Vd1=Vd2 (where the diffusion potential of PN junction is ignored); and the areas S1 and S2 are respectively an integral value of the electric field strength and indicate the potential). In other words, as illustrated in FIG. 4C and FIG. 5C, the embodiment is capable of relieving the potential gradient in the drift layer (N−) as compared with the comparative form (i.e., bringing the drift layer into a low electric field thereinside).

Accordingly, in the embodiment as compared with the comparative form, the attraction of carriers into the drain (N+) side can be weakened. When the field effect transistor is being turned on, the current density in the drift layer (N−) can be reduced. Thus, it is possible to suppress the polarity of a net charge in the depletion layer of the drift layer (N−) from being inverted due to the influence of a current and suppress an effective channel from being spread to the drain (N+) (i.e., the generation of the Kirk effect around the drain). Thus, the above effect can be obtained because the impurity concentration of the second conductivity type of the first region (below the drain) is lower than the impurity concentration of the second conductivity type of the second region (embedded layer (P)).

(3) Further, since it is possible to reduce impact ionization around the drain 9 by the Kirk effect, a Kink phenomenon (sudden increase in saturation drain current) in the vicinity of the drain 9 can be relieved. Thus, it is possible to improve the drain breakdown voltage (BVdss-ON) in the on state. That is, with no presence of the embedded layer 51 below the drain 9, the Kink phenomenon in the vicinity of the drain can be relieved, and ON-BVdss can hence be improved.

It is to be noted that preferably, the embedded layer 51 is beneath the drift layer 21 and is not disposed below the part of the drain 9. Since the suppression of the Kirk effect and the RESURF effect are placed in a trade-off relation, the Kirk effect can sufficiently be suppressed while obtaining the RESURF effect sufficiently since the embedded layer 51 is not disposed below the part of the drain 9.

(Modifications)

(1) In the above first embodiment, the semiconductor device may be configured by mix-loading the LDMOS transistor 50 and other elements (e.g., pMOS transistors, resistive elements or capacitors, etc.) in the same silicon substrate 1. Even in such a case, effects similar to the effects (1) to (3) of the above first embodiment are brought about.

(2) Also, in the above first embodiment, it is shown where the LDMOS transistor 50 is the N-channel type, but the LDMOS transistor 50 may be a P-channel type. That is, in the first embodiment, the N-type and the P-type may respectively be replaced with the P-type and the N-type. Even in such a case, effects similar to the effects (1) to (3) of the above first embodiment are brought about.

Further, in the above first embodiment, the embedded layers 51 are disposed on both sides below the drain 9, but the embedded layer 51 may be disposed only on the side close to the channel region, of both sides below the drain 9 (only the embedded layer 51 on the left side of FIG. 1). That is, the embedded layer 51 may be disposed only beneath the drift region of the drift layer 21. Even in such a case, effects similar to the effects (1) to (3) of the above first embodiment are brought about.

(3) Further, in the above first embodiment, for example, as illustrated in FIG. 1, a description has been made about the case where the embedded layers 51 are disposed beneath the drift layer 21. However, in the present invention, the positional relationship between the drift layer 21 and the embedded layers 51 is not limited to this. The embedded layers 51 may be disposed in the drift layer 21 rather than beneath the drift layer 21.

Figure 6:
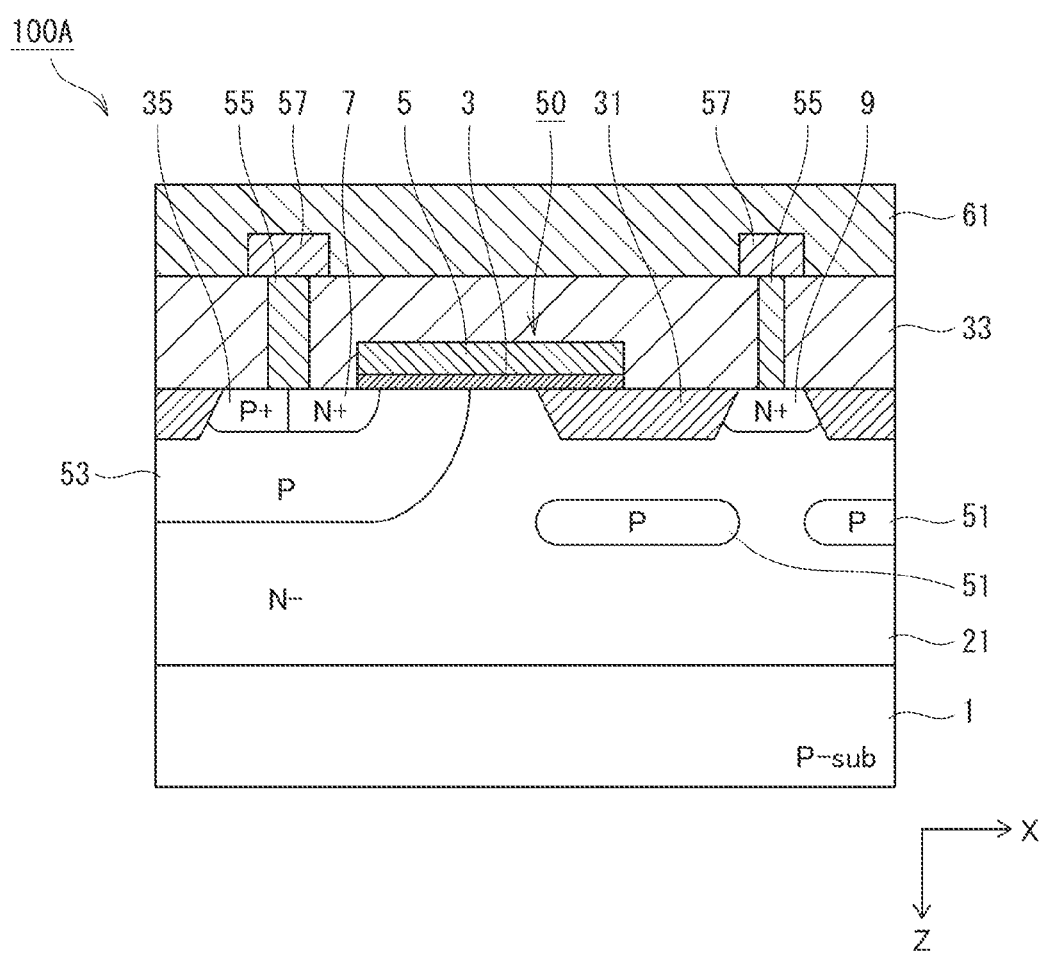
FIG. 6 is a cross-sectional view illustrating a configuration example (first modification) of a semiconductor device 100A according to a first embodiment.

FIG. 6 is a cross-sectional view illustrating a configuration example (first modification) of a semiconductor device 100A according to a first embodiment of the present invention. As illustrated in FIG. 6, in this semiconductor device 100A, a drift layer 21 is formed thick so as to surround a body layer 53 (i.e., contact a lower portion of the body layer 53). Then, each embedded layer 51 is disposed in the drift layer 21 which surrounds this body layer 53. That is, each embedded layer 51 is disposed below a field oxide film 31 in the drift layer 21 except for below at least a part of a drain 9. Even in such a case, effects similar to the effects (1) to (3) of the above first embodiment are brought about.

(4) Furthermore, the first modification illustrated in FIG. 6 has described the case where the embedded layers 51 are disposed on both sides below the drain 9 as viewed in cross section. However, in the present invention, the embedded layers 51 are not necessarily required to be disposed on both sides below the drain 9. The embedded layer 51 may be disposed on at least the side close to a channel region, of both sides below the drain 9.

Figure 7:
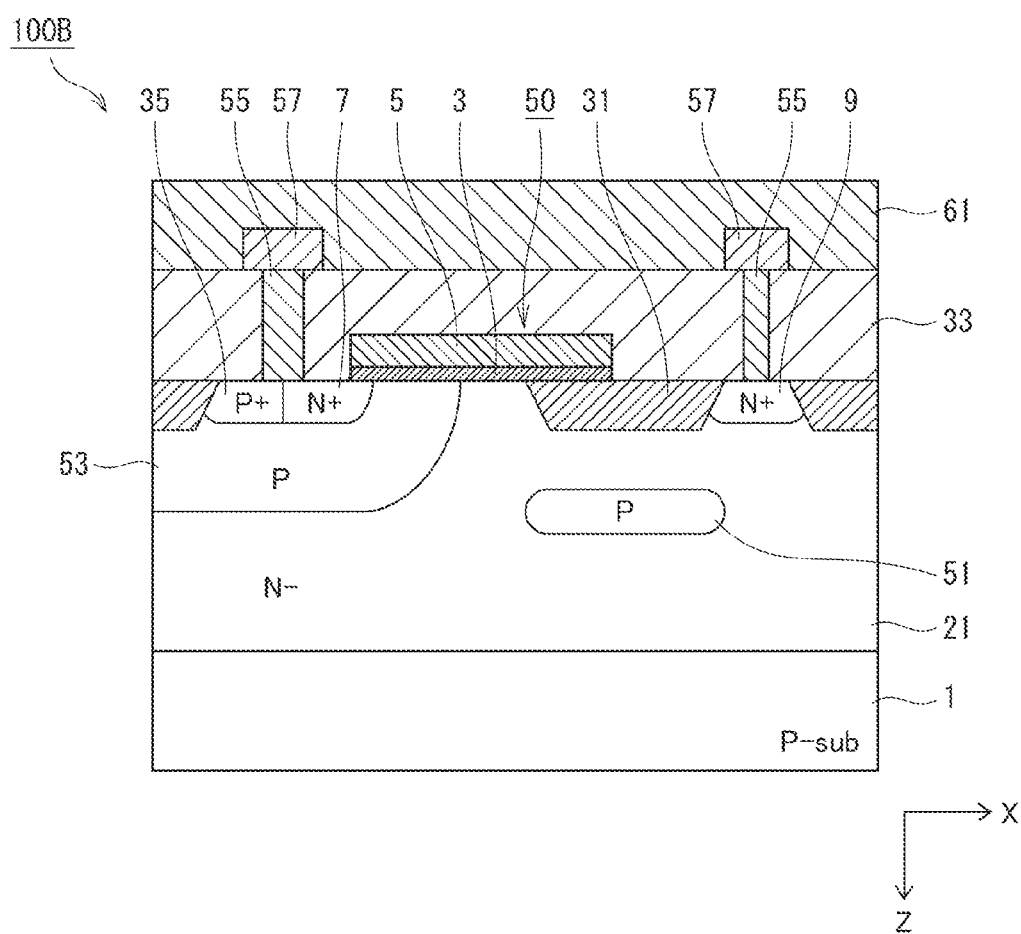
FIG. 7 is a cross-sectional view illustrating a configuration example (second modification) of a semiconductor device 100B according to a first embodiment.

FIGS. 7A to 7C are cross-sectional views illustrating a configuration example (second modification) of a semiconductor device 100B according to a first embodiment of the present invention. As illustrated in FIGS. 7A to 7C, in this semiconductor device 100B, an embedded layer 51 is disposed only on the side close to a channel region, of both sides below a drain 9. That is, the embedded layer 51 is disposed only beneath a drift region of a drift layer 21. Even in such a case, effects similar to the effects (1) to (3) of the above first embodiment are brought about.

(5) Still further, both of the above first and second modifications have described the case where each embedded layer 51 is disposed in the drift layer 21 and the upper and lower portions of the embedded layer 51 are respectively in contact with the drift layer 21. In such modifications, however, the lower portion of the embedded layer 51 may be in contact with the silicon substrate 1 rather than the drift layer 21.

Figure 8:
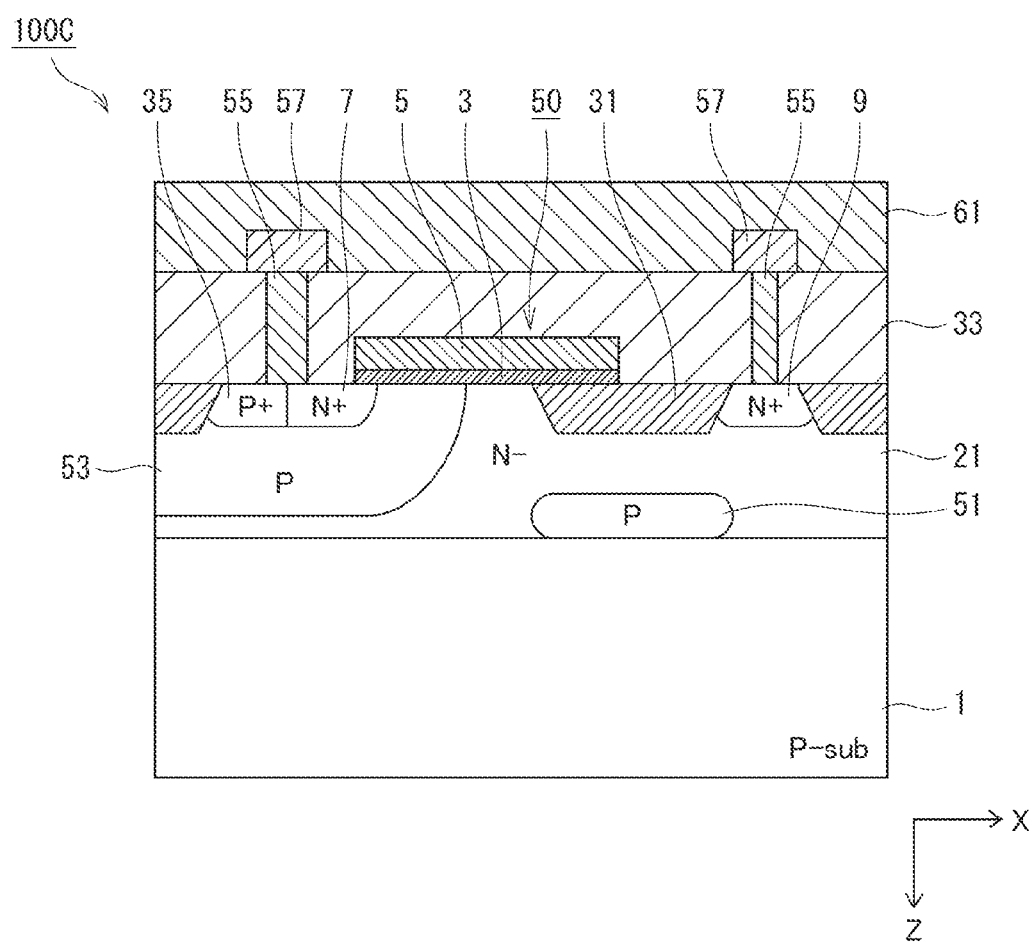
FIG. 8 is a cross-sectional view illustrating a configuration example (third modification) of a semiconductor device 100C according to a first embodiment.

FIGS. 8A to 8C are cross-sectional views illustrating a configuration example (third modification) of a semiconductor device 100C according to a first embodiment of the present invention. As illustrated in FIGS. 8A to 8C, in this semiconductor device 100C, an embedded layer 51 is disposed in a drift layer 21. Further, an upper portion of the embedded layer 51 is in contact with the drift layer 21, and a lower portion of the embedded layer 51 is in contact with a silicon substrate 1. That is, the embedded layer 51 is disposed at the bottom of the drift layer 21. Even in such a case, effects similar to the effects (1) to (3) of the above first embodiment are brought about.

(6) Still further, the LDMOS transistor 50 may further be provided with, for example, a P-type impurity diffusion layer (second impurity diffusion layer of second conductivity type) disposed below at least a portion of the drain 9. A P-type impurity concentration of this P-type impurity diffusion layer is lower than a P-type impurity concentration of the P-type embedded layer 51. Even in such a case, effects similar to the effects (1) to (3) of the above first embodiment are brought about.

Second Embodiment

The above first embodiment has described the case where the drift layer is composed of one layer. In the present invention, however, the configuration of the drift layer is not limited to this. That is, in the present invention, the drift layer may be composed of two or more layers different in N-type impurity concentration. In the second embodiment, a description will be made about the case where the drift layer is composed of two layers.

(Structure)

Figure 9:
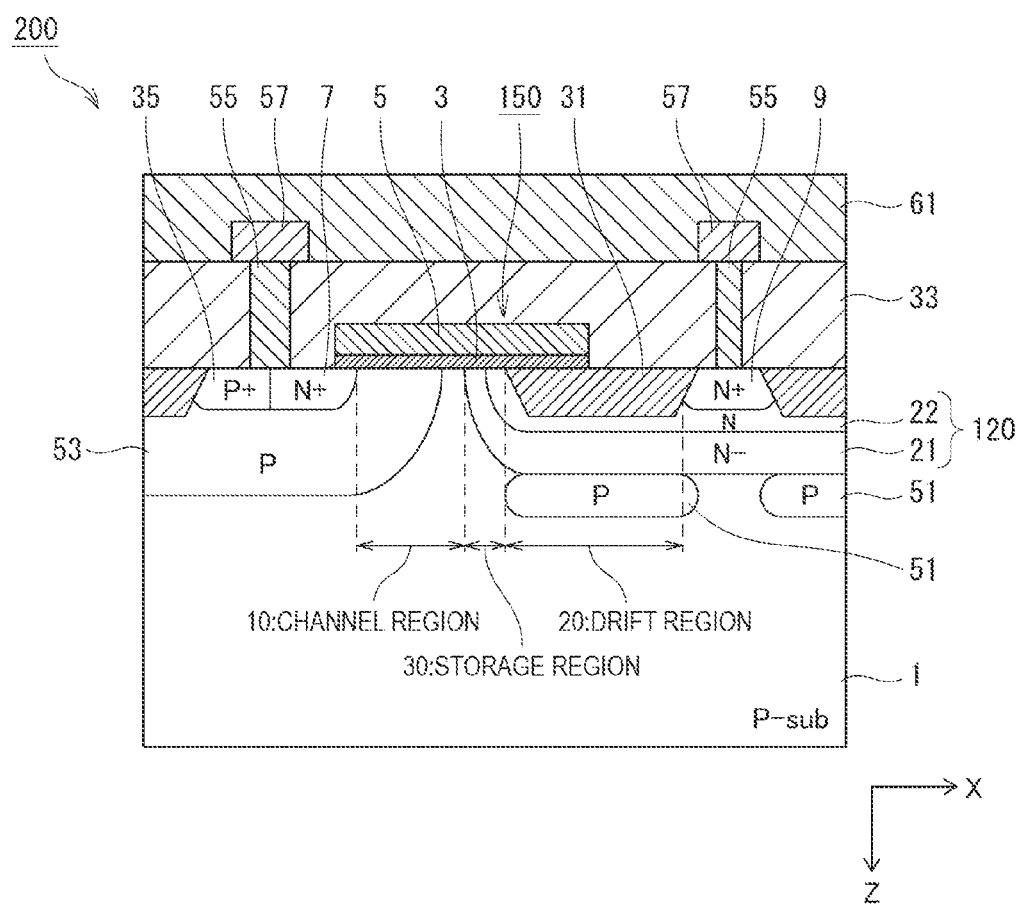
FIG. 9 is a cross-sectional view illustrating a configuration example of a semiconductor device 200 according to a second embodiment.

FIG. 9 is a cross-sectional view illustrating a configuration example of a semiconductor device 200 according to a second embodiment of the present invention. As illustrated in FIG. 9, this semiconductor device 200 is provided with, for example, a P-type silicon substrate 1, an N-channel type LDMOS transistor 150 formed in this silicon substrate 1, an interlayer insulating film 33 which is disposed on the silicon substrate 1 and covers the LDMOS transistor 150, a contact electrode 55 which penetrates through the interlayer insulating film 33 and is connected to the LDMOS transistor 150, a wiring layer 57, and a protective film 61.

The LDMOS transistor 150 is provided with a gate insulating film 3, a gate electrode 5, a source 7 and drain 9 of N-type, a field oxide film 31, an N-type drift layer 120 disposed beneath an N-type drift region 20 and drain 9 of the silicon substrate 1, a P-type embedded layer 51, a P-type body layer 53, and a P-type pickup layer 35.

The drift layer 120 is a two-layer structure and has a first drift layer (N− layer) 21, and a second drift layer (N layer) 22 disposed on the first drift layer 21, having a higher N-type impurity concentration than the first drift layer 21. An upper portion of the second drift layer 22 is in contact with the field oxide film 31. Further, the second drift layer 22 extends from below an end portion of the field oxide film 31 to the channel region 10 side and constitutes a part of a storage region 30.

(Manufacturing Method)

A manufacturing method of the semiconductor device 200 illustrated in FIG. 9 will next be described.

Figure 10A:
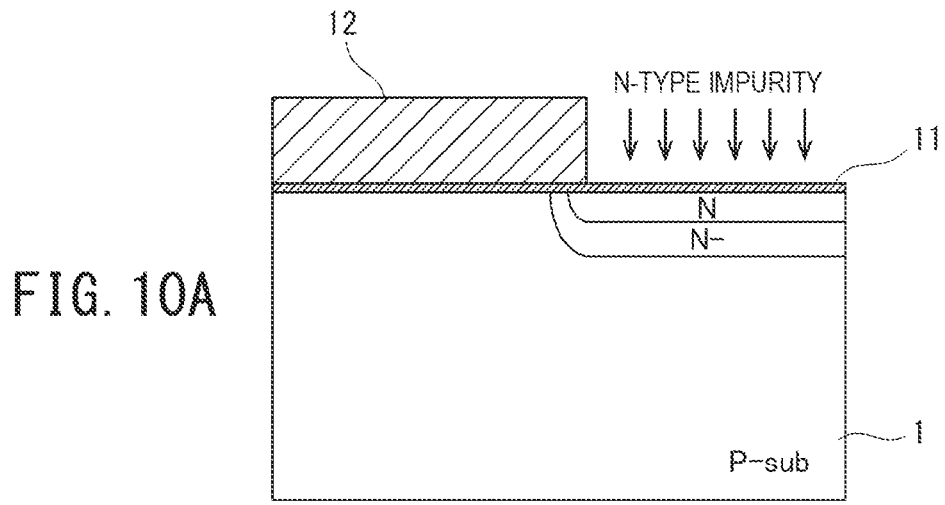
FIGS. 10A to 10C are cross-sectional views illustrating a manufacturing method of the semiconductor device 200 in a process order.

FIGS. 10A to 10C and FIGS. 11A to 11C are respectively cross-sectional views illustrating the manufacturing method of the semiconductor device 200 in a process order. As illustrated in FIG. 10A, a silicon oxide film 11 is first formed on a silicon substrate 1, and a resist pattern 12 is formed thereon. Next, an N-type impurity such as phosphorus is ion-implanted in the silicon substrate 1 using this resist pattern 12 as a mask.

In this ion implantation process, a step (hereinafter, a first drift ion implantation step) for forming a first drift layer 21 and a step (hereinafter, a second drift ion implantation step) for forming a second drift layer 22 are carried out. For example, in the second drift ion implantation step, implantation energy is set smaller than in the first drift ion implantation step to make the depth of an impurity distribution shallow. Further, in the second drift ion implantation step, the dose of an N-type impurity is set larger than that in the first drift ion implantation step to increase an impurity concentration.

Figure 10B:
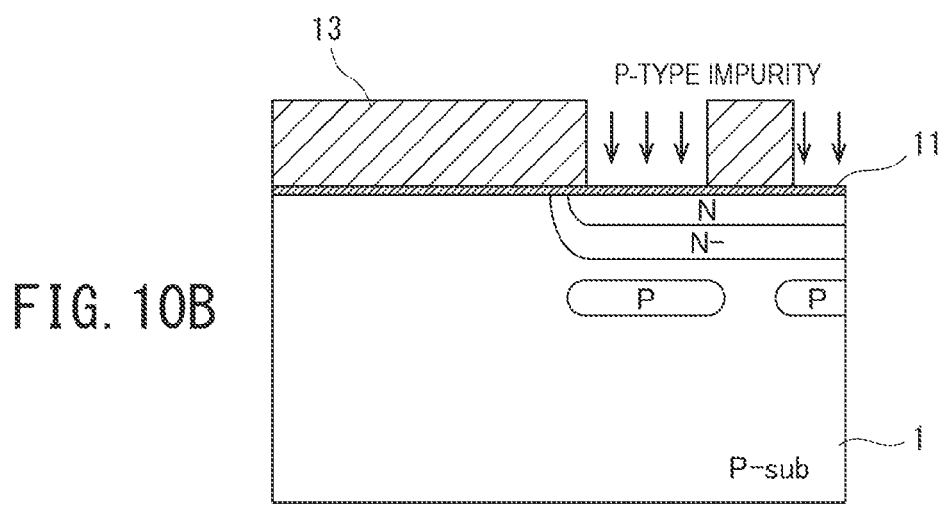
Figure 10C:
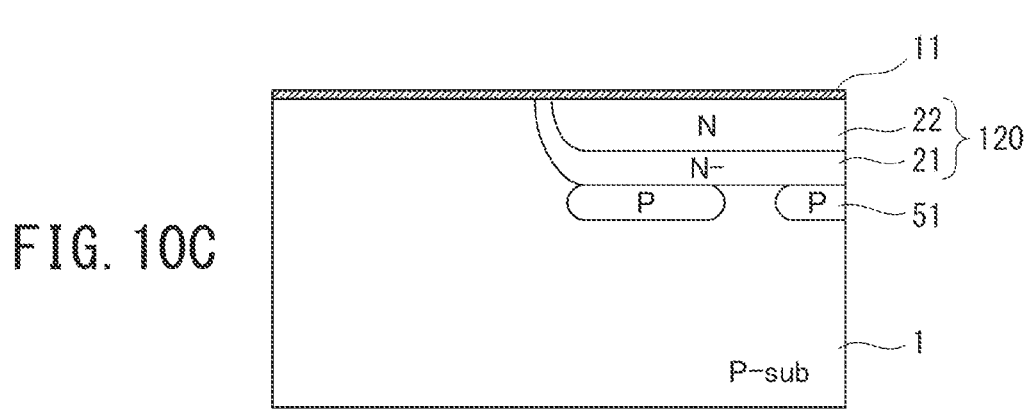

Next, the resist pattern 12 is removed from above the silicon substrate 1. Then, as illustrated in FIG. 10B, a resist pattern 13 is formed on the silicon oxide film 11. Next, a P-type impurity such as boron is ion-implanted in the silicon substrate 1 using this resist pattern 13 as a mask. After the ion implantation, the resist pattern 13 is removed from above the silicon substrate 1. Thereafter, the silicon substrate 1 is subjected to heat treatment to diffuse the impurity in the silicon substrate 1. Thus, as illustrated in FIG. 10C, an N-type first drift layer 21, a second drift layer 22 and a P-type embedded layer 51 are formed in the silicon substrate 1.

Figure 11A:
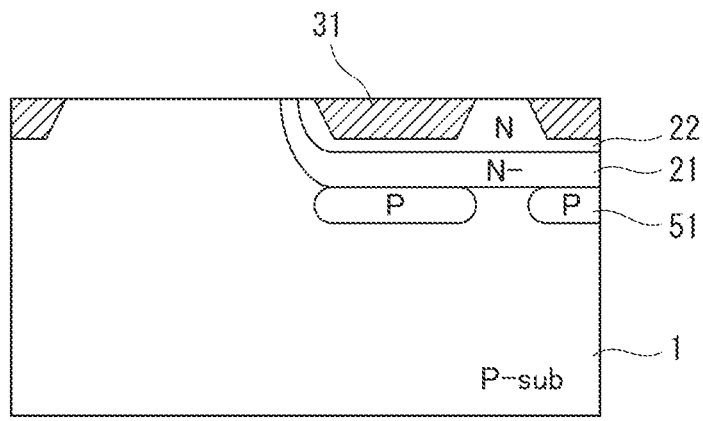
FIGS. 11A to 11C are cross-sectional views illustrating the manufacturing method of the semiconductor device 200 in a process order.
Figure 11B:
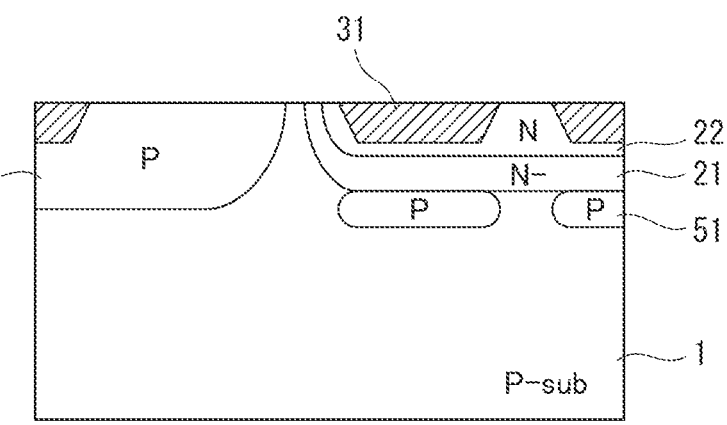
Figure 11C:
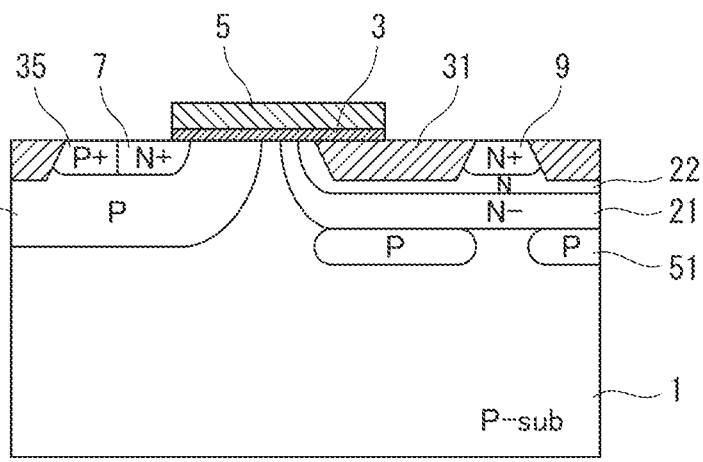

Steps subsequent to this are the same as those in the first embodiment. That is, as illustrated in FIG. 11A, a field oxide film 31 is formed in the silicon substrate 1. Next, as illustrated in FIG. 11B, a P-type body layer 53 is formed in the silicon substrate 1. Then, as illustrated in FIG. 11C, a gate insulating film 3, a gate electrode 5, a source 7 and drain 9, and a pickup layer 35 are sequentially formed.

Further, an interlayer insulating film 33 (refer to FIG. 9), a contact electrode 55 (refer to FIG. 9), a wiring layer 57 (refer to FIG. 9), and a protective film 61 (refer to FIG. 9) are sequentially formed. The semiconductor device 200 illustrated in FIG. 9 is completed through the above steps.

In the second embodiment, the LDMOS transistor 150 corresponds to the "field effect transistor" of the present invention. Further, the drift layer 120 corresponds to the "drift layer" of the present invention, the first drift layer 21 corresponds to the "first drift layer" of the present invention, and the second drift layer 22 corresponds to the "second drift layer" of the present invention. Other correspondence relations are the same as the first embodiment.

Effects of Second Embodiment

The second embodiment of the present invention brings about effects similar to the effects (1) to (3) of the first embodiment.

(1) Also, since it is possible to obtain a RESURF effect, it is possible to increase the impurity concentration near the surface of the drift region 20 as in the second drift layer 22. Thus, the on-resistance can be reduced while maintaining OFF-BVdss high.

(2) Further, due to the presence of the second drift layer 22, when the field effect transistor is being turned on, the polarity of a net charge in the depletion layer of the drift region 20 can be further suppressed from being inverted due to the influence of a drain voltage and the embedded layer 51. It is possible to further suppress the Kirk effect from occurring around the drain.

(Modifications)

Even in the second embodiment, the modifications (1) to (5) of the first embodiment may be applied. Even in such a case, effects similar to the effects of the above second embodiment are brought about. One of the modifications of the second embodiment is illustrated.

Figure 12:
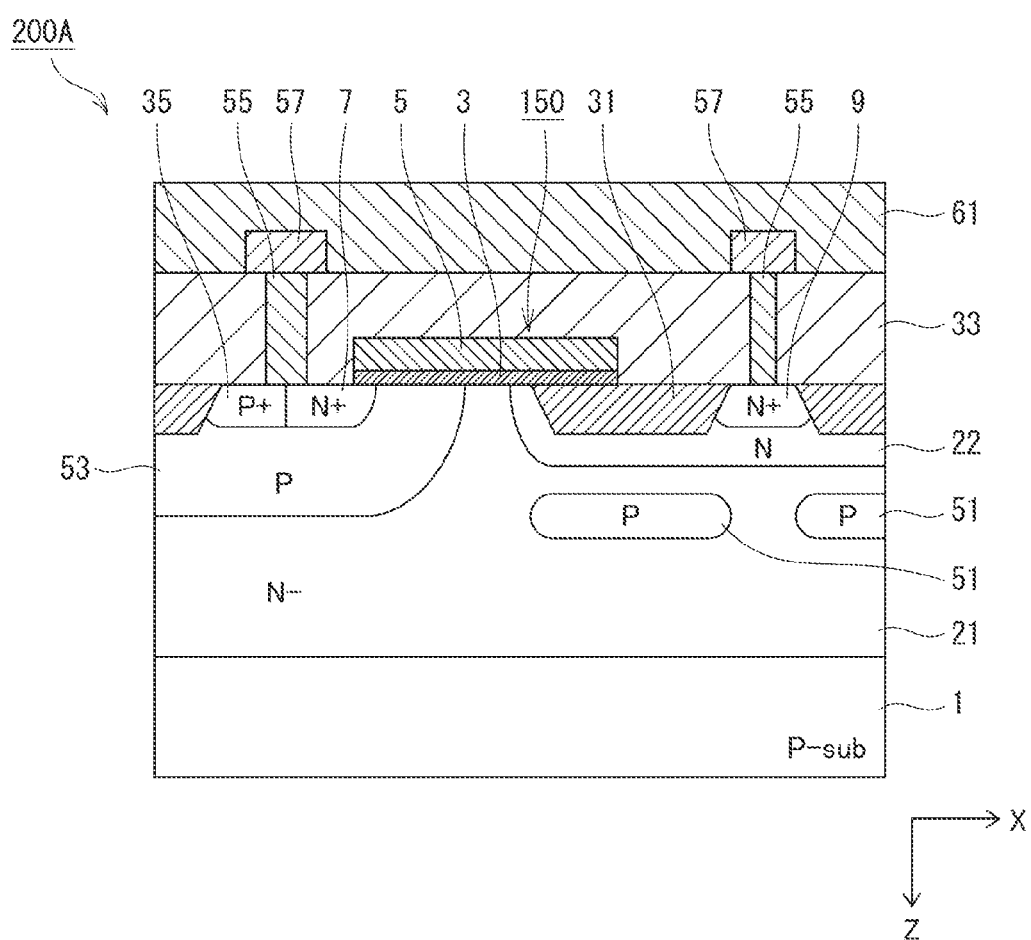
FIG. 12 is a cross-sectional view illustrating a configuration example (modification) of a semiconductor device 200A according to a second embodiment.

FIG. 12 is a cross-sectional view illustrating a configuration example (modification) of a semiconductor device 200A according to a second embodiment of the present invention. As illustrated in FIG. 12, in this semiconductor device 200A, a first drift layer 21 is formed thick so as to surround a body layer 53. Then, embedded layers 51 are disposed in the first drift layer 21 which covers this body layer 53. That is, each embedded layer 51 is disposed below a field oxide film 31 except for below at least a part of a drain 9 in the first drift layer 21. Further, a second drift layer 22 having a higher N-type impurity concentration than the first drift layer 21 is provided between the drain 9 and the embedded layer 51.

Third Embodiment

In a third embodiment, a description will be made about a drift layer is composed of three layers.

(Structure)

FIGS. 13A to 13C are cross-sectional views illustrating a configuration example of a semiconductor device 300 according to the third embodiment of the present invention. As illustrated in FIGS. 13A to 13C, this semiconductor device 300 is provided with, for example, a P-type silicon substrate 1, an N-channel type LDMOS transistor 250 formed in this silicon substrate 1, an interlayer insulating film 33 which is disposed on the silicon substrate 1 and covers the LDMOS transistor 250, a contact electrode 55 which penetrates through the interlayer insulating film 33 and is connected to the LDMOS transistor 250, a wiring layer 57, and a protective film 61.

The LDMOS transistor 250 is provided with a gate insulating film 3, a gate electrode 5, a source 7 and drain 9 of N-type, a field oxide film 31, an N-type drift layer 220 disposed beneath an N-type drift region 20 and drain 9 of the silicon substrate 1, a P-type embedded layer 51, a P-type body layer 53, and a P-type pickup layer 35.

The drift layer 220 is a three-layer structure and has a first drift layer (N− layer) 21, a second drift layer (N layer) 22 disposed on the first drift layer 21, having a higher N-type impurity concentration than the corresponding first drift layer 21, and a third drift layer (N layer) 23 disposed on the first drift layer 21, having a higher N-type impurity concentration than the second drift layer 22. Further, this third drift layer 23 is disposed beneath the field oxide film 31, and its upper portion is in contact with the field oxide film 31.

(Manufacturing Method)

Figure 13:
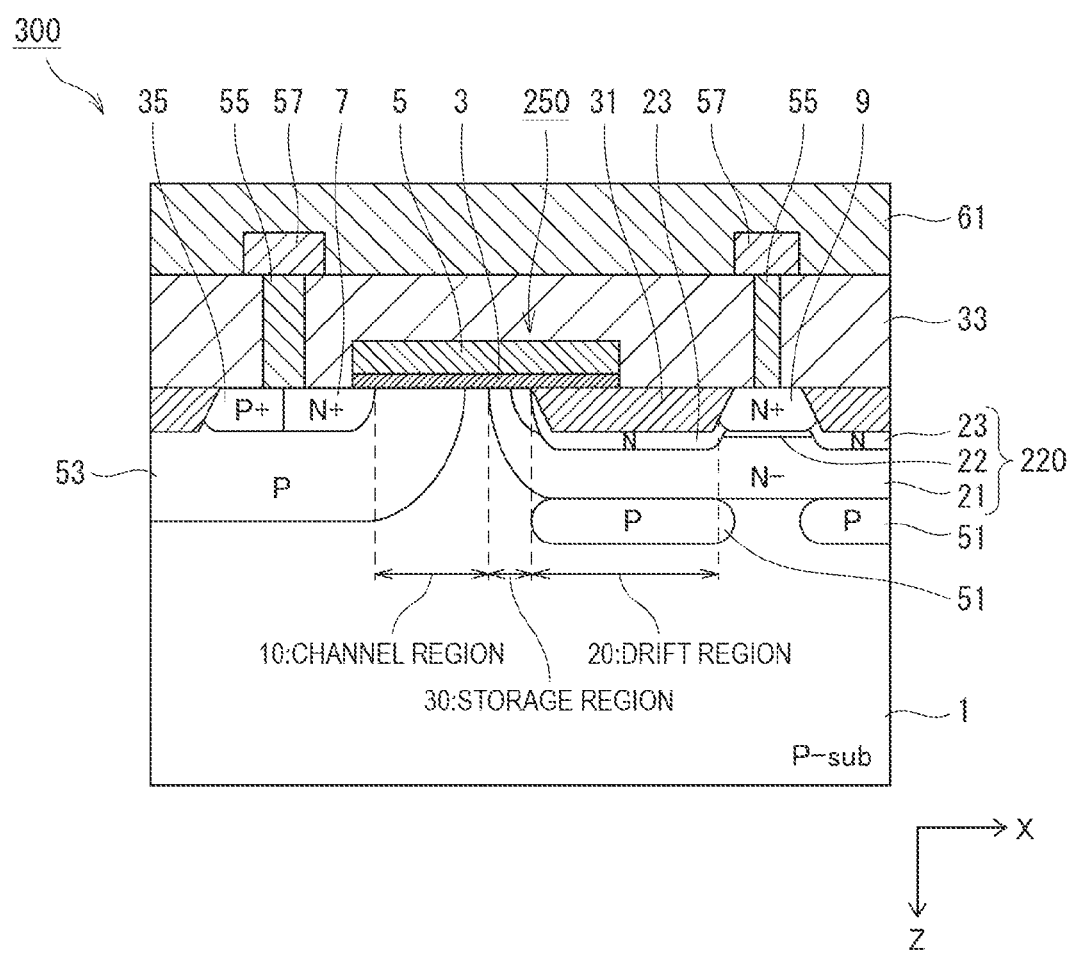
FIG. 13 is a cross-sectional view illustrating a configuration example of a semiconductor device 300 according to a third embodiment.

A manufacturing method of the semiconductor device 300 illustrated in FIG. 13 will next be described.

Figure 14A:
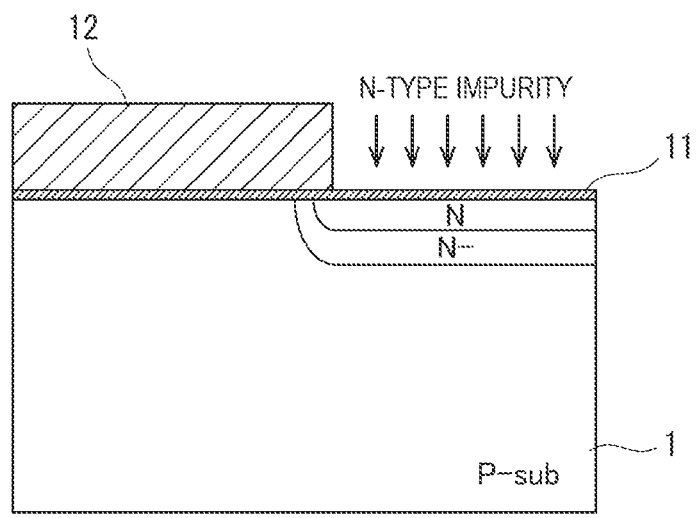
FIGS. 14A to 14C are cross-sectional views illustrating a manufacturing method of the semiconductor device 300 in a process order.

FIGS. 14A, 14B and FIGS. 15A to 15C are respectively cross-sectional views illustrating the manufacturing method of the semiconductor device 300 in a process order. As illustrated in FIG. 14A, a silicon oxide film 11 is first formed on a silicon substrate 1, and a resist pattern 12 is formed thereon. Next, an N-type impurity such as phosphorus is ion-implanted in the silicon substrate 1 using this resist pattern 12 as a mask. In this ion implantation process, a first drift ion implantation step and a second drift ion implantation step are carried out as with the second embodiment. Thereafter, the resist pattern 12 is removed from above the silicon substrate 1.

Figure 14B:
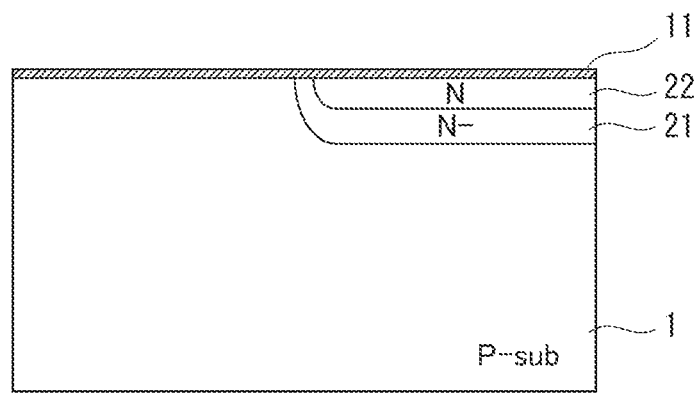

Next, the silicon substrate 1 is subjected to heat treatment to diffuse the impurity in the silicon substrate 1. Thus, as illustrated in FIG. 14B, a first drift layer 21 and second drift layer 22 of N-type are formed in the silicon substrate 1.

Figure 14C:
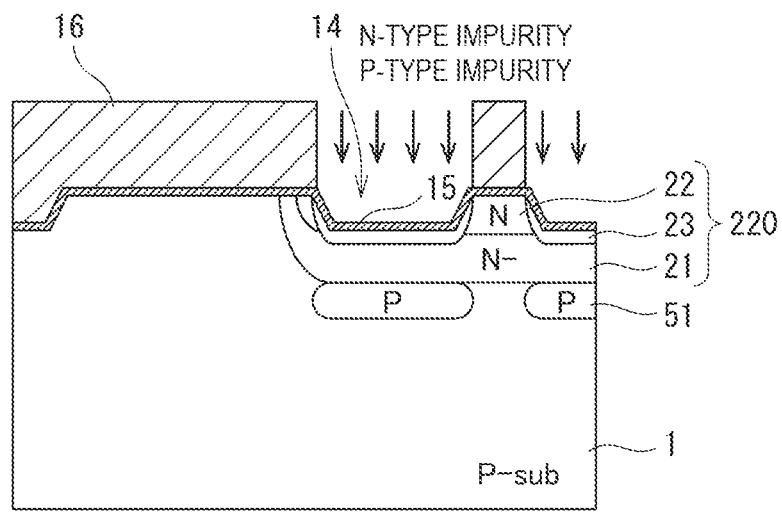

Next, as illustrated in FIG. 14C, a trench 14 for forming a field oxide film is formed in the silicon substrate 1. Further, the silicon substrate 1 is thermally oxidized to form a silicon oxide film 15. Then, a resist pattern 16 is formed above the silicon substrate 1 through the silicon oxide film 15, for example. This resist pattern 16 has a shape to open upper parts of a region for forming a P-type embedded layer and a region for forming a drift layer and cover regions other than those.

Next, a P-type impurity such as boron is ion-implanted in the silicon substrate 1 using this resist pattern 16 as a mask. Further, before and after the ion implantation of this P-type impurity, an N-type impurity such as phosphorus is ion-implanted in the silicon substrate 1 using the resist pattern 16 as a mask. After the ion implantation, the resist pattern 16 is removed from above the silicon substrate 1. Thereafter, the silicon substrate 1 is subjected to heat treatment to diffuse the impurity in the silicon substrate 1. Thus, an embedded layer 51 and a third drift layer 23 are formed.

Figure 15A:
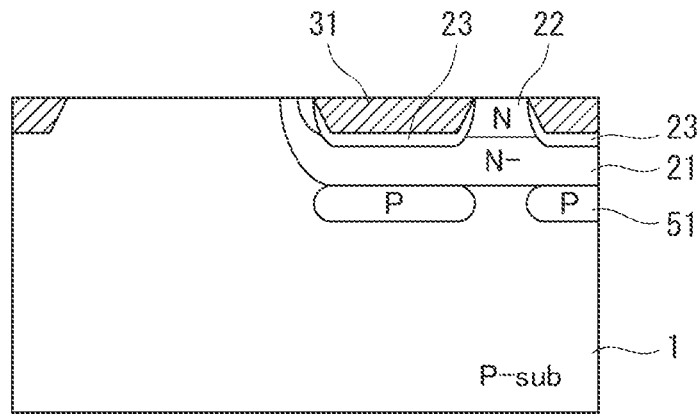
FIGS. 15A to 15C are cross-sectional views illustrating the manufacturing method of the semiconductor device 300 in a process order.

Next, a silicon oxide film is embedded in the trench 14. Thus, as illustrated in FIG. 15A, a field oxide film 31 is formed. It is to be noted that the silicon oxide film 15 is removed in the process of forming the field oxide film 31, for example.

Figure 15B:
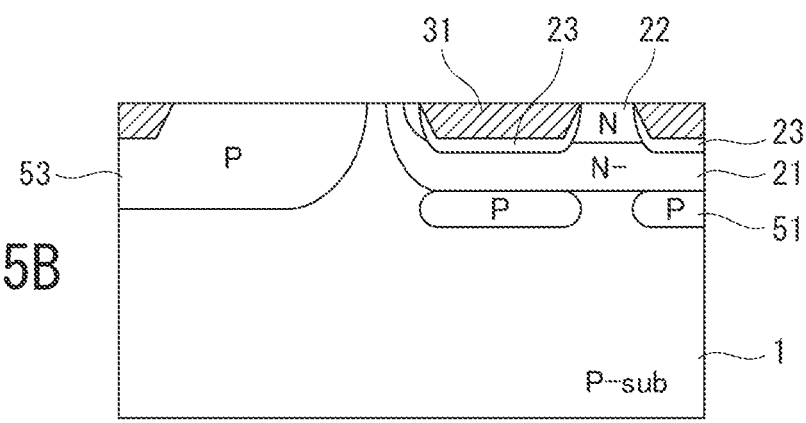
Figure 15C:
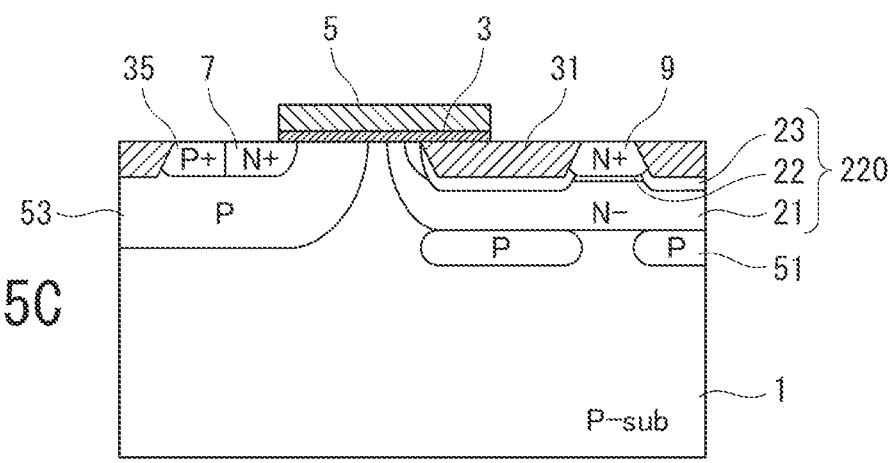

Steps subsequent to this are the same as those in the first embodiment. That is, as illustrated in FIG. 15B, a P-type body layer 53 is formed in the silicon substrate 1. Next, as illustrated in FIG. 15C, a gate insulating film 3, a gate electrode 5, a source 7 and a drain 9, and a pickup layer 35 are sequentially formed. Then, an interlayer insulating film 33 (refer to FIG. 13), a contact electrode 55 (refer to FIG. 13), a wiring layer 57 (refer to FIG. 13), and a protective film 61 (refer to FIG. 13) are sequentially formed. The semiconductor device 300 illustrated in FIG. 13 is completed through the above steps.

In the third embodiment, the LDMOS transistor 250 corresponds to the "field effect transistor" of the present invention. Further, the drift layer 220 corresponds to the "drift layer" of the present invention, the first drift layer 21 corresponds to the "first drift layer" of the present invention, the second drift layer 22 corresponds to the "second drift layer" of the present invention, and the third drift layer 23 corresponds to the "third drift layer" of the present invention. Other correspondence relations are the same as the first embodiment.

Effects of Third Embodiment

The third embodiment of the present invention brings about effects similar to the effects (1) to (3) of the first embodiment and the effects (1) and (2) of the second embodiment.

Also, since it is possible to obtain a RESURF effect, it is possible to increase the impurity concentration near the surface of the drift region 20 as in the third drift layer 23. Thus, the on-resistance can be further reduced while maintaining OFF-BVdss high. Trade-off characteristics of a drain breakdown voltage and an on-resistance can be further improved.

Here, since the third drift layer 23 is formed after etching of the trench 14, the impurity dose of the third drift layer 23 is no affected by variations in etching of the trench 14. That is, manufacturing variations in on-resistance and RESURF effect are low. Further, since the second drift layer 22 and the third drift layer 23 are separately formed, the on-resistance and the RESURF effect can be optimized beneath the field oxide film and at the edge of the field oxide film respectively.

(Modification)

Even in the third embodiment, the modifications (1) to (5) of the first embodiment may be applied. Even in such a case, effects similar to the effects of the above third embodiment are brought about.

Fourth Embodiment

The above first to third embodiments have described the case where the field oxide film is formed by the STI method. In the present invention, however, the method of forming the field oxide film is not limited to the STI method. In a fourth embodiment, a description will be made about the case where a field oxide film is formed by a LOCOS (LOCal Oxidation of Silicon) method.

(Structure)

Figure 16:
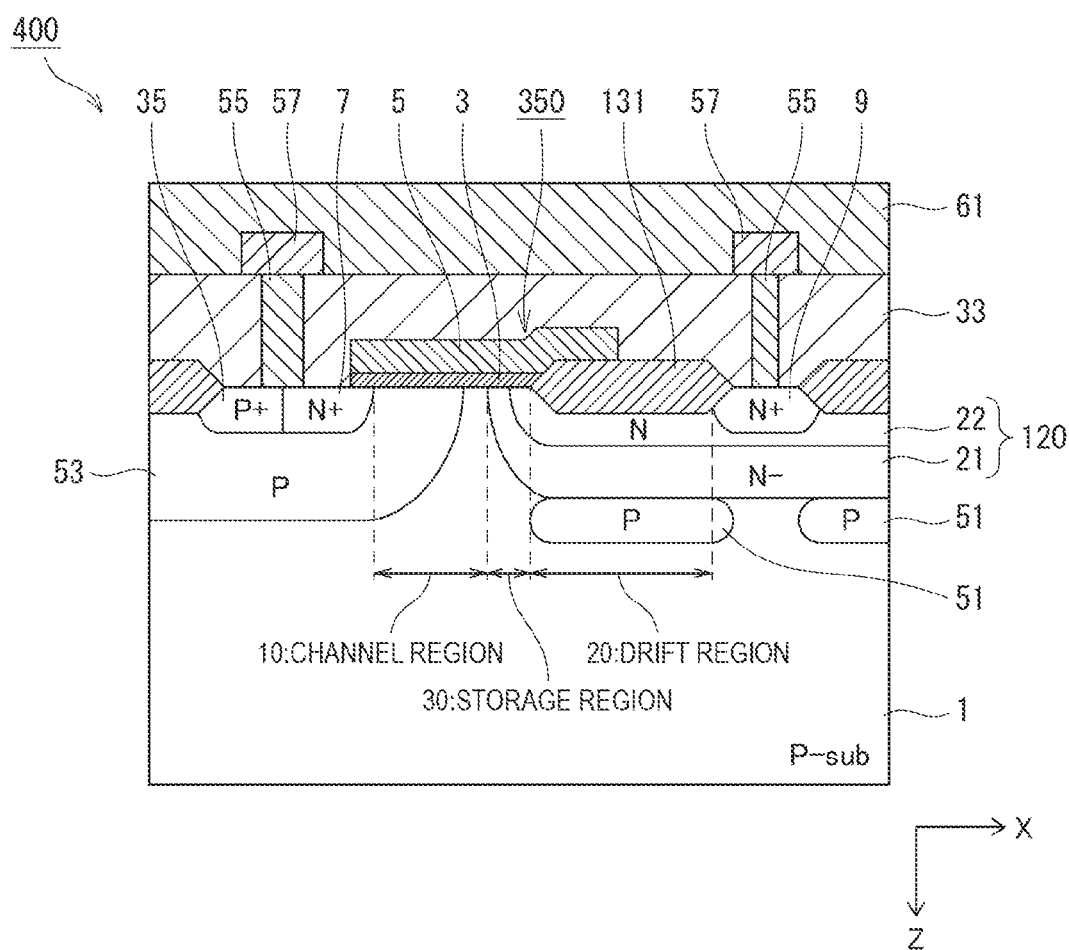
FIG. 16 is a cross-sectional view illustrating a configuration example of a semiconductor device 400 according to a fourth embodiment.

FIG. 16 is a cross-sectional view illustrating a configuration example of a semiconductor device 400 according to the fourth embodiment of the present invention. As illustrated in FIG. 16, this semiconductor device 400 is provided with, for example, a P-type silicon substrate 1, an N-channel type LDMOS transistor 350 formed in this silicon substrate 1, an interlayer insulating film 33 which is disposed on the silicon substrate 1 and covers the LDMOS transistor 350, a contact electrode 55 which penetrates through the interlayer insulating film 33 and is connected to the LDMOS transistor 350, a wiring layer 57, and a protective film 61.

The LDMOS transistor 350 is provided with a gate insulating film 3, a gate electrode 5, a source 7 and drain 9 of N-type, a field oxide film 131, an N-type drift layer 120 disposed beneath an N-type drift region 20 and the drain 9 of the silicon substrate 1, a P-type embedded layer 51, a P-type body layer 53, and a P-type pickup layer 35. Here, the field oxide film 131 is a silicon oxide film formed by the LOCOS method.

(Manufacturing Method)

A manufacturing method of the semiconductor device 400 illustrated in FIG. 16 will next be described.

Figure 17A:
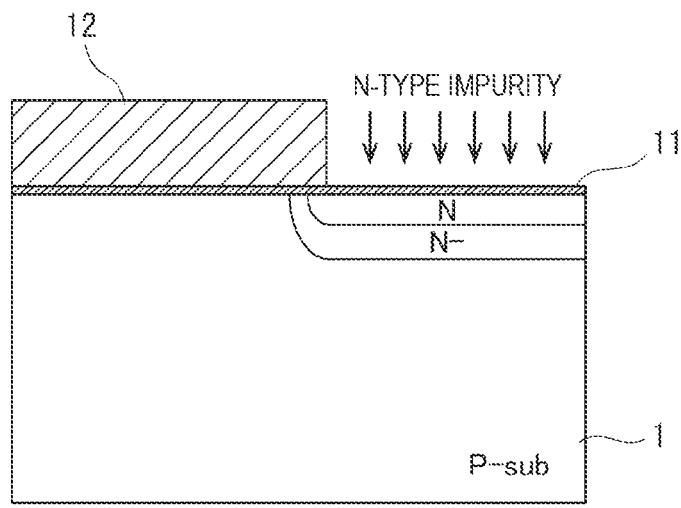
FIGS. 17A to 17C are cross-sectional views illustrating a manufacturing method of the semiconductor device 400 in a process order.

FIGS. 17A to 17C, FIGS. 18A and 18B are respectively cross-sectional views illustrating the manufacturing method of the semiconductor device 400 in a process order. As illustrated in FIG. 17A, a silicon oxide film 11 is first formed on a silicon substrate 1, and a resist pattern 12 is formed thereon. Next, an N-type impurity such as phosphorus is ion-implanted in the silicon substrate 1 using this resist pattern 12 as a mask. In this ion implantation process, a first drift ion implantation step and a second drift ion implantation step are carried out as similar to the second embodiment.

Figure 17B:
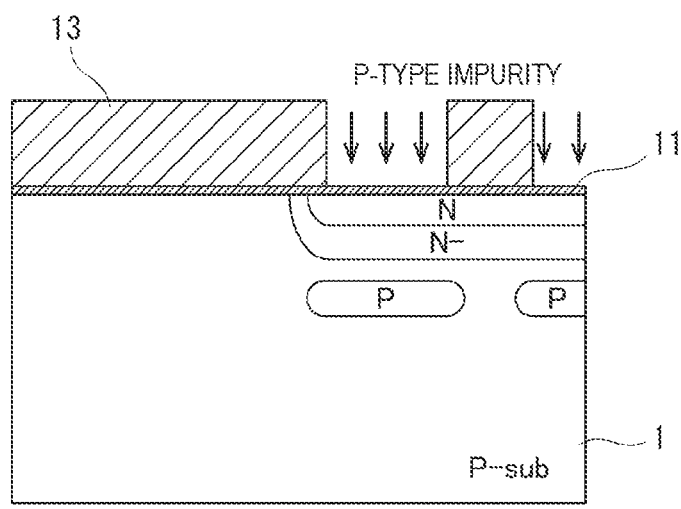

Next, the resist pattern 12 is removed from above the silicon substrate 1. Then, as illustrated in FIG. 17B, a resist pattern 13 is formed on the silicon oxide film 11. Next, a P-type impurity such as boron is ion-implanted in the silicon substrate 1 using this resist pattern 13 as a mask. After the ion implantation, the resist pattern 13 is removed from above the silicon substrate 1.

Figure 17C:
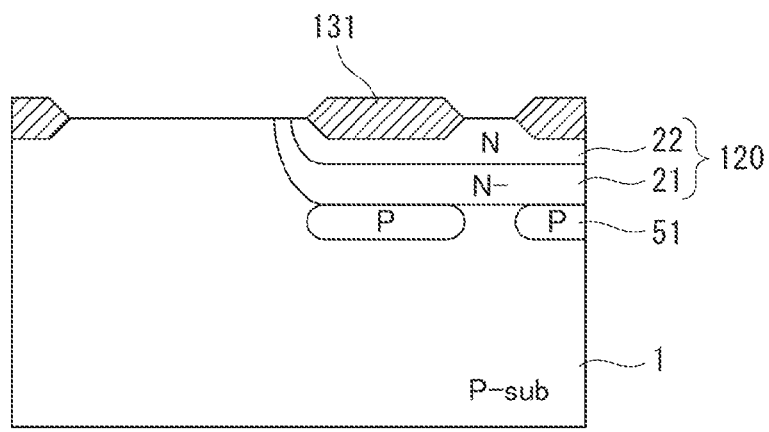

Next, a field oxide film 131 is formed in the silicon substrate 1 using the LOCOS method. The LOCOS method is a method of thermally oxidizing the silicon substrate 1 using a silicon nitride film as a mask to thereby form a silicon oxide film thick only in a region exposed from beneath the mask. The impurity is diffused in the silicon substrate 1 by heat treatment at the time of field oxidation. Thus, as illustrated in FIG. 17C, an N-type first drift layer 21, a second drift layer 22, and a P-type embedded layer 51 are formed in the silicon substrate 1.

Figure 18A:
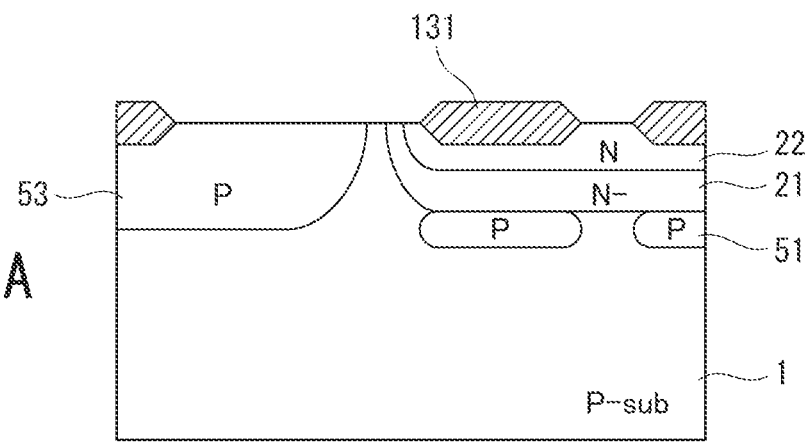
FIGS. 18A and 18B are cross-sectional views illustrating the manufacturing method of the semiconductor device 400 in a process order.
Figure 18B:
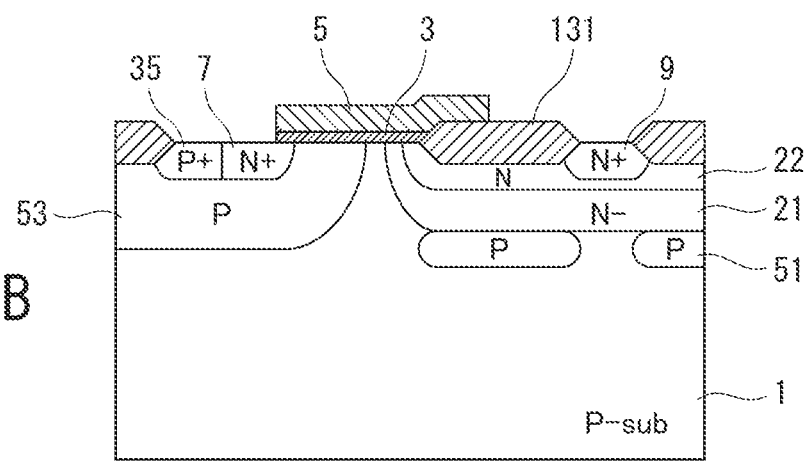

Steps subsequent to this are the same as those in the first embodiment. That is, as illustrated in FIG. 18A, a P-type body layer 53 is formed in the silicon substrate 1. Next, as illustrated in FIG. 18B, a gate insulating film 3, a gate electrode 5, a source 7 and a drain 9, and a pickup layer 35 are sequentially formed. Then, an interlayer insulating film 33 (refer to FIG. 16), a contact electrode 55 (refer to FIG. 16), a wiring layer 57 (refer to FIG. 16), and a protective film 61 (refer to FIG. 16) are sequentially formed. The semiconductor device 400 illustrated in FIG. 16 is completed through the above steps.

In the fourth embodiment, the LDMOS transistor 350 corresponds to the "field effect transistor" of the present invention. Further, the field oxide film 131 corresponds to the "field oxide film" of the present invention. Other correspondence relations are the same as the first embodiment.

Effects of Fourth Embodiment

The fourth embodiment of the present invention brings about effects similar to the effects (1) to (3) of the first embodiment and the effects (1) and (2) of the second embodiment.

(Modification)

Even in the fourth embodiment, the modifications (1) to (5) of the first embodiment may be applied. Even in such a case, effects similar to the effects of the above fourth embodiment are brought about.

Fifth Embodiment (Structure)

Figure 19:
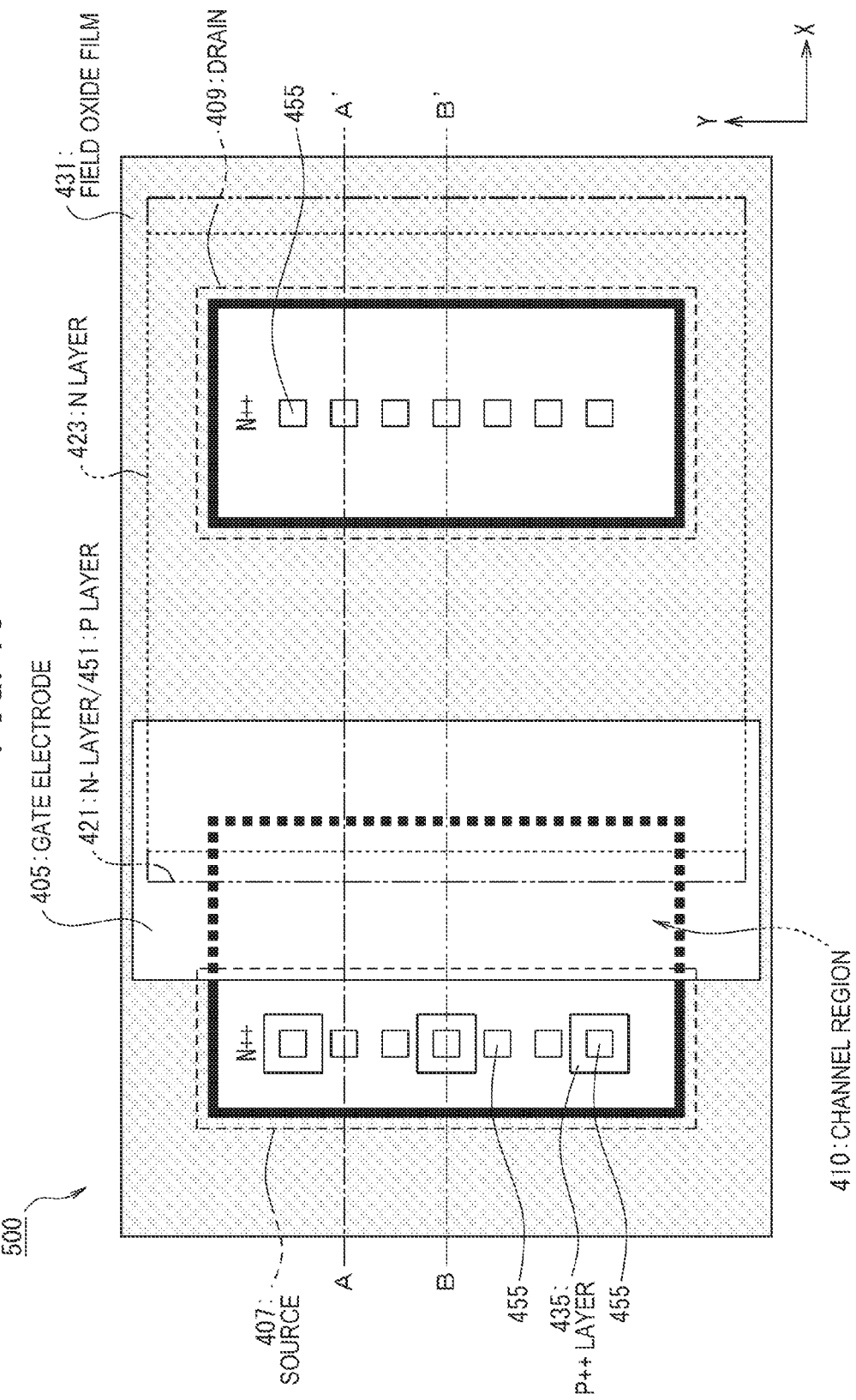
FIG. 19 is a plan view illustrating a configuration example of an LDMOS transistor 500 according to a fifth embodiment.
Figure 20:
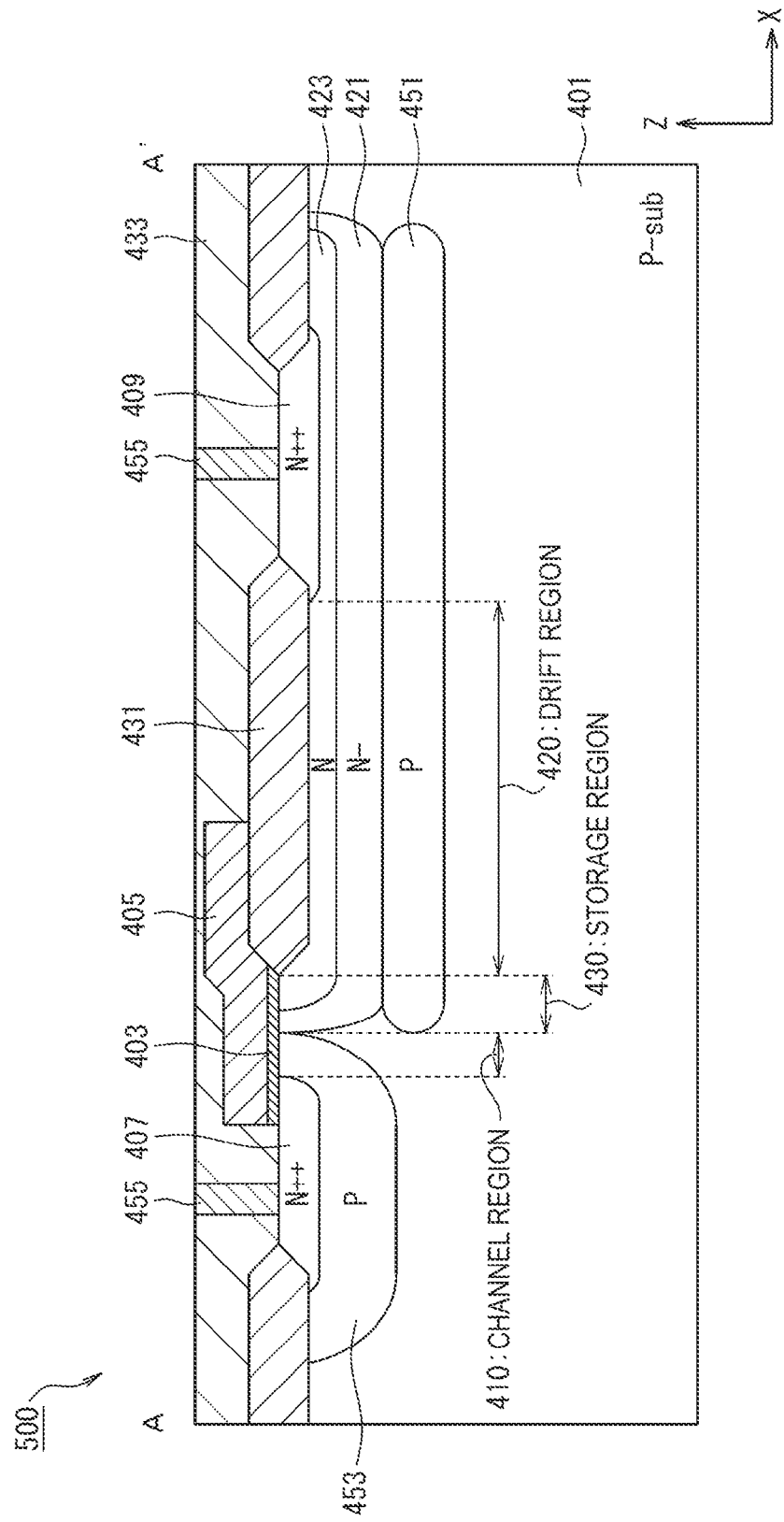
FIG. 20 is an A-A' cross-sectional view illustrating a configuration example of the LDMOS transistor 500.
Figure 21:
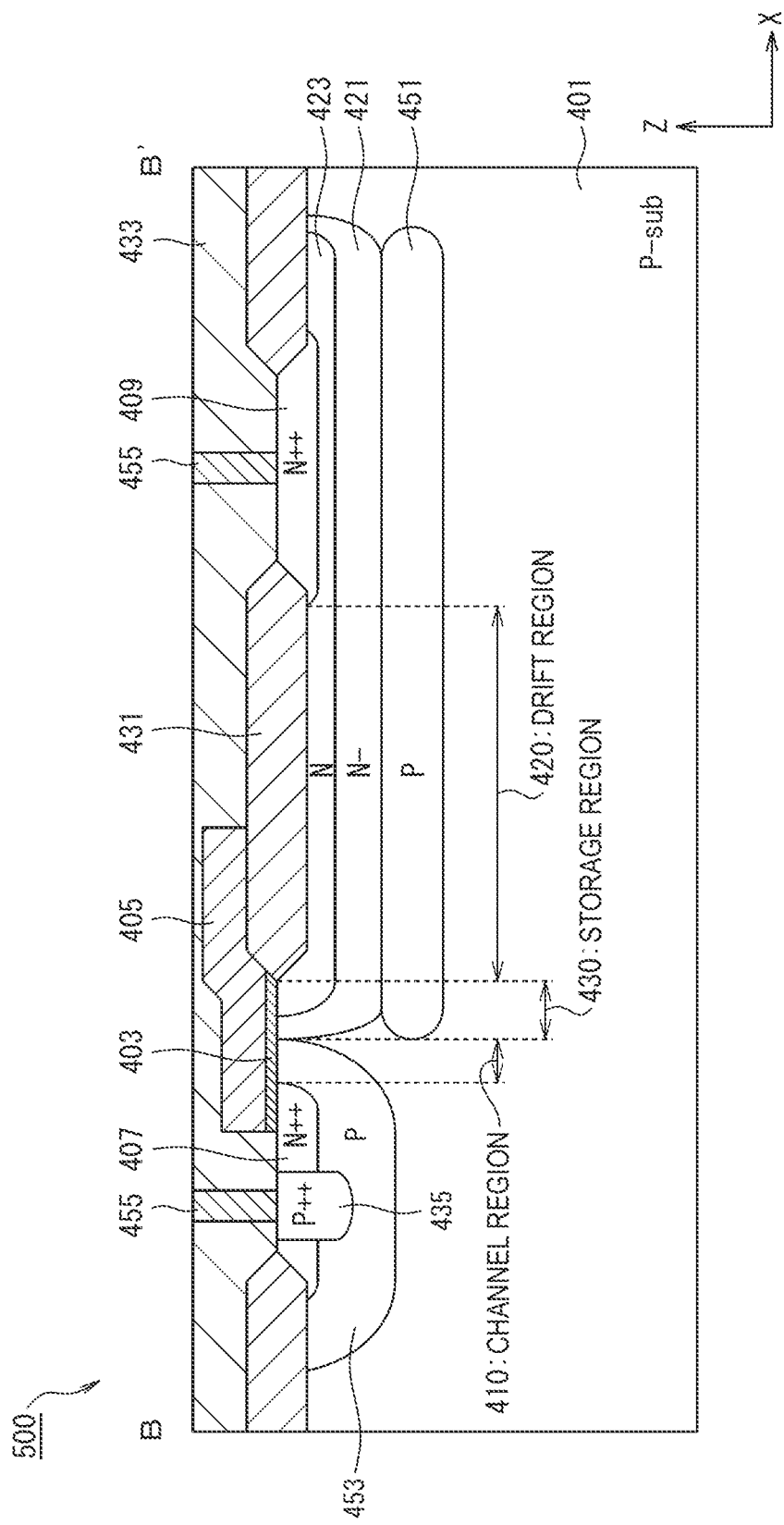
FIG. 21 is a B-B' cross-sectional view illustrating a configuration example of the LDMOS transistor 500.

FIG. 19 is a plan view illustrating a configuration example of an LDMOS transistor 500 according to a fifth embodiment of the present invention. Further, FIG. 20 and FIG. 21 are respectively an A-A' cross-sectional view and a B-B' cross-sectional view illustrating the configuration example of the LDMOS transistor 500. It is to be noted that the illustration of an interlayer insulating film is omitted in FIG. 19 to avoid complication of the drawing.

As illustrated in FIG. 19 to FIG. 21, this LDMOS transistor 500 is, for example, an N-channel type field effect transistor formed in a P-type silicon substrate 401 (P-sub). This LDMOS transistor 500 is provided with a silicon substrate 401, a gate insulating film 403 formed on the silicon substrate 401, a gate electrode 405, a source 407 and drain 409 of N-type formed in the silicon substrate 401 beneath both sides of the gate electrode 405, an N-type drift region 420 disposed between a region (hereinafter, a channel region) 410 to be a channel of the silicon substrate 401 and the drain 409, a field oxide film 431 disposed on the drift region 420, an interlayer insulating film 433 which covers the silicon substrate 401 thereover, a gate electrode 405, and contact electrodes 455 for respectively drawing out the source 407 and the drain 409 onto the interlayer insulating film 433.

As illustrated in FIG. 20 and FIG. 21, the gate electrode 405 is formed from above the gate insulating film 403 onto the field oxide film 431. Further, the source 407 and the drain 409 respectively include an N-type impurity in high concentration and are exposed from under the field oxide film 431. The source 407 and the drain 409 are composed of an N layer 423 to be described later or an N++ layer having a higher N-type impurity concentration than an N+ layer 471.

The gate insulating film 403 is a silicon oxide film obtained by thermally oxidizing the silicon substrate 401, for example. The field oxide film 431 is, for example, a LOCOS (Local Oxidation of Silicon) film.

The drift region 420 has an N– drift layer (hereinafter an N– layer) 421 provided in the silicon substrate 1 and including an N-type impurity, and a first drain extension (hereinafter, an N layer) 423 provided in the silicon substrate 401, having a higher N-type impurity concentration than the N– layer 421. As illustrated in FIG. 20 and FIG. 21, the N layer 423 is disposed on the N– layer 421 and is in contact with the drain 409. Further, an upper portion of the N layer 423 is in contact with the field oxide film 431.

Further, in a channel length direction (i.e., X-axis direction), the N layer 423 and the N– layer 421 extend from below an end portion of the field oxide film 431 to the channel region 410 side and constitute a storage region 430. It is to be noted that the storage region is a region in which majority carriers are attracted to the gate insulating film side and accumulated when a positive bias is applied to the gate electrode.

Further, this LDMOS transistor 500 is provided with a first P-type embedded layer (first PBL; hereinafter, a P layer) 451 disposed directly below the N layer 423 and the N– layer 421, a P-type body layer (P-body layer) 453 formed from below the source 407 to the channel region 410, and a high concentration P-type impurity diffusion layer (P++ layer) 435 disposed inside the source 407 and electrically connected to the P-body layer 453. In this embodiment, for example, the P-body layer 453 constitutes the channel region 410. Any of the P layer 451, the P-body layer 453 and the P++ layer 435 includes a higher P-type impurity concentration than the silicon substrate 401. Further, for example, the P++ layer 435 includes a higher P-type impurity concentration than the P-body layer 453, and the P-body layer 453 includes a higher P-type impurity concentration than the P layer 451.

As illustrated in FIG. 19 and FIG. 21, the contact electrodes 455 are respectively disposed on the source 407 and the P++ layer 435. These contact electrodes 455 are electrically connected by, for example, an unillustrated wiring layer disposed on the interlayer insulating film 433. Thus, the source 407, the P-body layer 453, and the silicon substrate 401 are capable of maintaining the same potential through the contact electrodes 455. Further, in this LDMOS transistor 500, the N– layer 421 is interposed between the P-body layer 453 and the N layer 423 in the channel length direction. It is possible to suppress an electric field from being concentrated on the end of the N layer 423 in the storage region 430.

In this fifth embodiment, the silicon substrate 401 corresponds to the "semiconductor substrate" of the present invention, and the LDMOS transistor 500 corresponds to the "field effect transistor" of the present invention. Also, the N-type corresponds to the "first conductivity type" of the present invention, and the P-type corresponds to the "second conductivity type" of the present invention. Further, the P layer 451 corresponds to the "first impurity diffusion layer" of the present invention. Furthermore, the N– layer 421 corresponds to the "first drift layer" of the present invention, and the N layer 423 corresponds to the "second drift layer" of the present invention.

Effects of Fifth Embodiment

The fifth embodiment of the present invention brings about the following effects.

(1) The P layer 451 is disposed directly below the N-type drift region 420. A PN junction is formed between the N– layer 421 and the P layer 451 which constitute the drift region 420. Thus, in the LDMOS transistor 500 in an off state, the drift region 420 can be efficiently depleted. When a reverse bias is applied between the source 407-drain 409 in a state in which the source 407 and the silicon substrate 401 are electrically connected, it becomes easy to fully deplete the drift region 420 at a stage in which the reverse bias is small. Thus, it is possible to relax the surface electric field of the drift region 420 (i.e., obtain a RESURF effect). It is possible to maintain a drain breakdown voltage (i.e., OFF-BVdss) in the off state high.

(2) Also, since the RESURF effect can be obtained, the N-type impurity concentration near the surface of the drift region 420 can be increased as in the N layer 423. It is thus possible to reduce on-resistance (RON.sp) while maintaining OFF-BVdss high. For example, as indicated by arrows in FIG. 22, trade-off characteristics of the drain breakdown voltage and the on-resistance can be improved.

Figure 22:
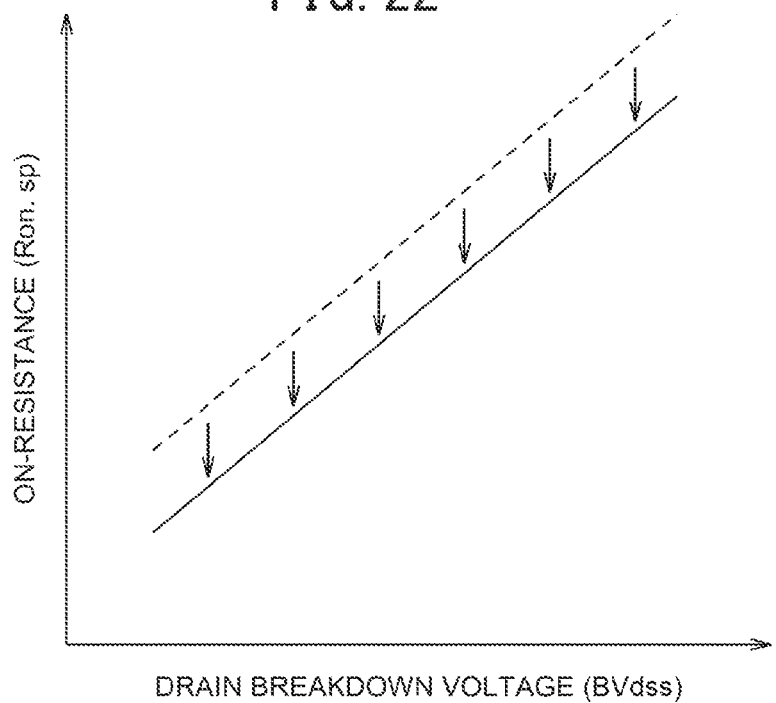
FIG. 22 is a view illustrating an improvement in the trade-off characteristics of a drain breakdown voltage and an on-resistance.

It is to be noted that in FIG. 22, BVdss of the horizontal axis is a voltage value when the current starts to flow from the drain 409 to the source 407 and the silicon substrate 401 by the avalanche breakdown when a reverse bias is applied to the drain 409 in a state in which the silicon substrate 401, the gate electrode 405 and the source 407 are electrically connected (i.e., off-state). Further, Ron•sp of the vertical axis is a resistance value between the source 407 and drain 409 when the LDMOS transistor 500 is being turned on, and a value indicating the resistance value per unit area of the device.

(3) Further, the N layer 423 including a higher N-type impurity concentration than the N− layer 421 (i.e., including in large numbers, electrons being majority carriers) is disposed on the N− layer 421. Thus, it is possible to suppress a net charge in the depletion layer of the drift region 420 from changing from plus (+) to minus (−) under the influence of the drain voltage and the P layer 423 when the LDMOS transistor 500 is being turned on. It is possible to suppress an effective channel from being spread to the drain 409 (i.e., the occurrence of the Kirk effect around the drain 409). Thus, since it is possible to prevent an electric field from being concentrated on the end portion of the drain 409, a drain breakdown voltage (i.e., ON-BVdss) in an on state can be maintained high as indicated by arrows in FIG. 23, for example.

Figure 23:
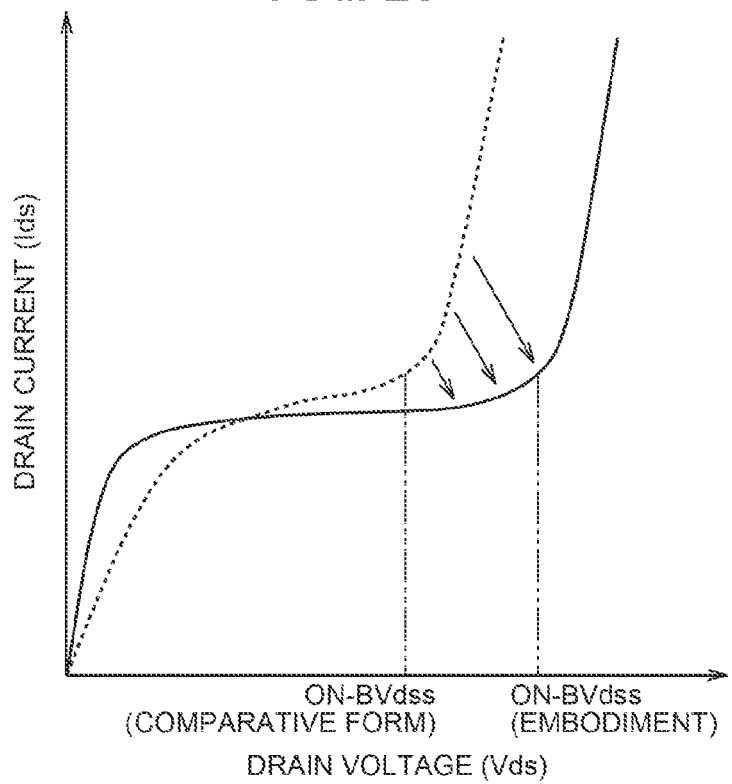
FIG. 23 is a view illustrating an improvement in ON-BVdss in an embodiment.

It is to be noted that in FIG. 23, Vds of the horizontal axis is a voltage value applied to the drain 409 in a state (i.e., an on state) in which the silicon substrate 401 and the source 407 are electrically connected and a constant bias is applied to the gate electrode 405. Ids of the vertical axis is a current value which flows from the drain 409 to the source 407. Further, a comparative form in FIG. 23 is a form in which no N layer 423 is provided in the LDMOS transistor 500. An embodiment in FIG. 23 is the LDMOS transistor 500 (i.e., a form provided with the N layer 423), for example.

(4) In addition, in the fifth embodiment of the present invention, the N layer 423 extends from below the end portion of the field oxide film 431 to the channel region 410 side in the channel length direction and constitutes the storage region 430. Thus, the occurrence of the Kirk effect can be suppressed even around the channel region 410 and the storage region 430.

(Modification)

(1) It is to be noted that in the above fifth embodiment, a description has been made about the case where in the positional relation between the N layer 423, the N− layer 421 and the P layer 451, the P layer 451 is located directly below the N layer 423 and the N− layer 421. In the first embodiment, however, the above positional relation is not limited to this. The P layer 451 may be disposed at a position slightly deviated from directly below the N layer 423 and the N− layer 421. Even in such a configuration, if there is at least a portion of the P layer 451 directly below the N layer 423 and the N− layer 421, it is possible to deplete the N layer 423 and the N− layer 421 from the side of the P layer 451 when the LDMOS transistor 500 is off and thereby obtain a RESURF effect.

(2) Also, in the above fifth embodiment, the semiconductor device may be configured by mix-loading the LDMOS transistor 500 and other elements (e.g., pMOS transistors, resistive elements or capacitors, etc.) in the same silicon substrate 1. Even in such a case, effects similar to the above fifth embodiment are brought about.

(3) Further, in the above fifth embodiment, it is shown that the LDMOS transistor 500 is the N-channel type, but the LDMOS transistor 500 may be a P-channel type. That is, in the first embodiment, the N-type and the P-type may respectively be replaced with the P-type and the N-type. Even in such a case, effects similar to the above fifth embodiment are brought about in the P-channel type LDMOS transistor 500.

(4) In addition, even in the fifth embodiment, the modifications (3) to (5) of the first embodiment may be applied. In this case, of the N− layer 421, a portion interposed between the N layer 423 and the P layer 451 corresponds to the "first drift layer of first conductivity type" of the present invention.

Sixth Embodiment

In the above fifth embodiment, it has been described that the RESURF effect can be obtained by disposing the P layer 451 beneath the N-type drift region 420. It has also been described that since the drift region 420 has the N layer 423, the on-resistance can be reduced and the occurrence of the Kirk effect can be suppressed. Here, in the embodiment of the present invention, a P-type impurity diffusion layer having a higher concentration than the P layer 451 may be disposed beneath the drift region 420, and an N-type impurity diffusion layer having a higher concentration than the N layer 423 may be added to the drift region 420. Such a form will be described in the sixth embodiment.

(Structure)

Figure 24:
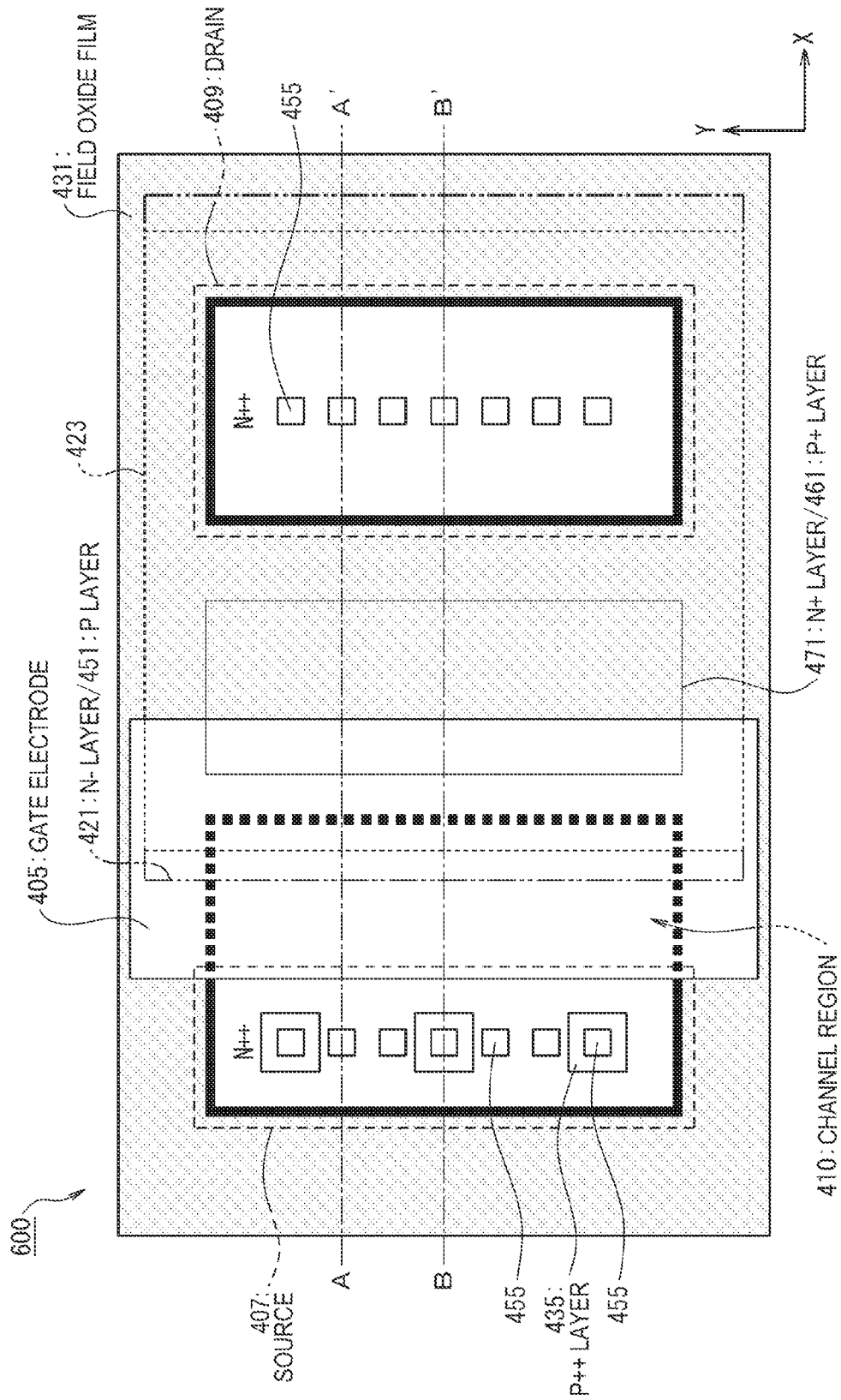
FIG. 24 is a plan view illustrating a configuration example of an LDMOS transistor 600 according to a sixth embodiment.
Figure 25:
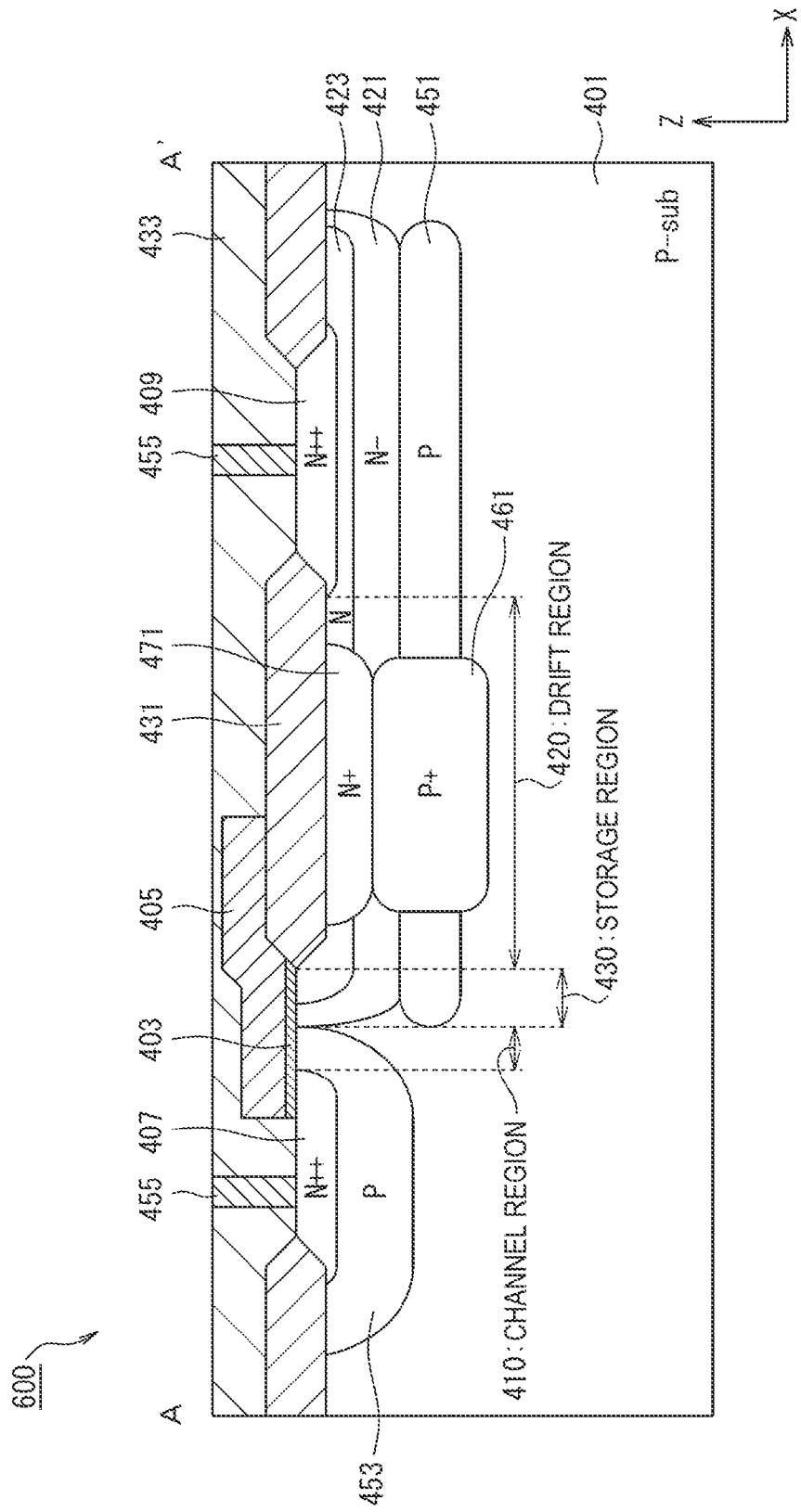
FIG. 25 is an A-A' cross-sectional view illustrating a configuration example of the LDMOS transistor 600.
Figure 26:
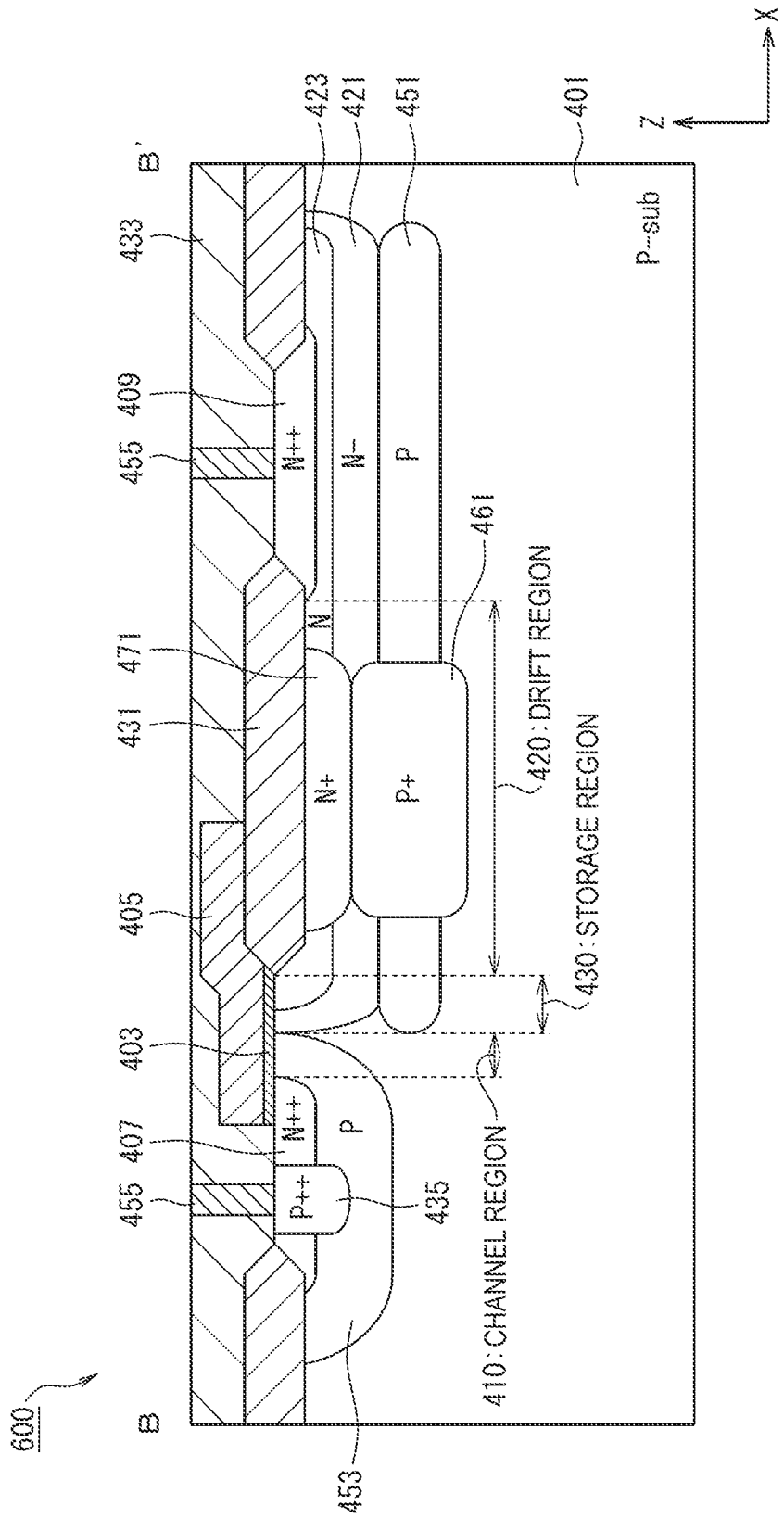
FIG. 26 is a B-B' cross-sectional view illustrating a configuration example of the LDMOS transistor 600.

FIG. 24 is a plan view illustrating a configuration example of an LDMOS transistor 600 according to the sixth embodiment of the present invention. Further, FIG. 25 and FIG. 26 are respectively an A-A' cross-sectional view and a B-B' cross-sectional view illustrating the configuration example of the LDMOS transistor 600 according to the sixth embodiment. It is to be noted that the illustration of an interlayer insulating film is omitted in FIG. 24 to avoid complication of the drawing.

As illustrated in FIG. 24 to FIG. 26, a structural difference between this LDMOS transistor 600 and the LDMOS transistor 500 described in the fifth embodiment resides in that a P+ layer 461 and an N+ layer 471 are added. The LDMOS transistor 500 and the LDMOS transistor 600 are the same in terms of configurations other than it.

That is, the LDMOS transistor 600 is provided with the P+ layer 461 disposed beneath the N-type drift region 420. The P+ layer 461 is higher in P-type impurity concentration than the P layer 451 and lower in P-type impurity concentration than the P++ layer 435. Further, the drift region 420 has the N+ layer 471 disposed on the P+ layer 461. The N+ layer 471 is higher in N-type impurity concentration than the N layer 423 and lower in N-type impurity concentration than the source 407 and the drain 409 each indicated by N++.

As illustrated in FIG. 25 and FIG. 26, the N+ layer 471 and the P+ layer 461 are located directly below the field oxide film 431. Also, the P+ layer 461 is located directly below the N+ layer 471. Further, a lower portion of the N+ layer 471 is in contact with the P+ layer 461, and an upper portion of the N+ layer 471 is in contact with the field oxide film 431.

In the sixth embodiment, the P+ layer 461 corresponds to the "second impurity diffusion layer" of the present invention, and the N+ layer 471 corresponds to the "third drift layer" of the present invention. Further, the LDMOS transistor 600 corresponds to the "field effect transistor" of the present invention. Other correspondence relations are the same as the fifth embodiment.

Effects of Sixth Embodiment

The sixth embodiment of the present invention brings about the following effects in addition to the effects corresponding to the effects (1) to (4) of the fifth embodiment.

(1) Since the P+ layer 461 having a higher P-type impurity concentration than the P layer 451 is disposed beneath the drift region 420, the RESURF effect can be further obtained. It is thus possible to further increase OFF-BVdss.

(2) Also, since the RESURF effect can be further enhanced, it is possible to further increase an N-type impurity concentration near the surface of the drift region 420 as in the N+ layer 471. Thus, it is possible to further increase OFF-BVdss and further reduce the on-resistance. Trade-off characteristics of the drain breakdown voltage and the on-resistance can be further improved.

(3) Further, the N+ layer 471 having a higher N-type impurity concentration than the N layer 423 is disposed on the P+ layer 461. Thus, it is possible to further suppress a net charge in the depletion layer of the drift region 420 from changing from plus (+) to minus (−) under the influence of the drain voltage, the P layer 451 and the P+ layer 461 when the LDMOS transistor 600 is being turned on. It is possible to further suppress the occurrence of the Kirk effect around the drain 409. Thus, it is possible to further prevent an electric field from being concentrated on the end portion of the drain 409 and further increase ON-BVdss.

(Modification)

(1) It is to be noted that the above sixth embodiment has described the case where the P+ layer 461 is located directly below the N+ layer 471. In the sixth embodiment, however, the above positional relation is not limited to this. The P+ layer 461 may be disposed at a location slightly deviated from directly below the N+ layer 471. Even in such a configuration, if there is at least a portion of the P+ layer 461 directly below the N+ layer 471, it is possible to deplete the N+ layer 471 from the side of the P+ layer 461 when the LDMOS transistor 600 is off and thereby obtain a RESURF effect.

(2) Further, the modifications (3) to (5) of the first embodiment and the modifications (1) to (3) of the fifth embodiment may be applied to the sixth embodiment.

Seventh Embodiment

The above sixth embodiment has described that the P layer 451 and the P+ layer 461 are disposed beneath the N-type drift region 420. Also the sixth embodiment has described that the drift region 420 has the N− layer 421, the N layer 423 and the N+ layer 471. In the embodiment of the present invention, however, the P layer 451 and the N layer 423 may be omitted in the form described in the sixth embodiment. Such a form will be described in a seventh embodiment.

(Structure)

Figure 27:
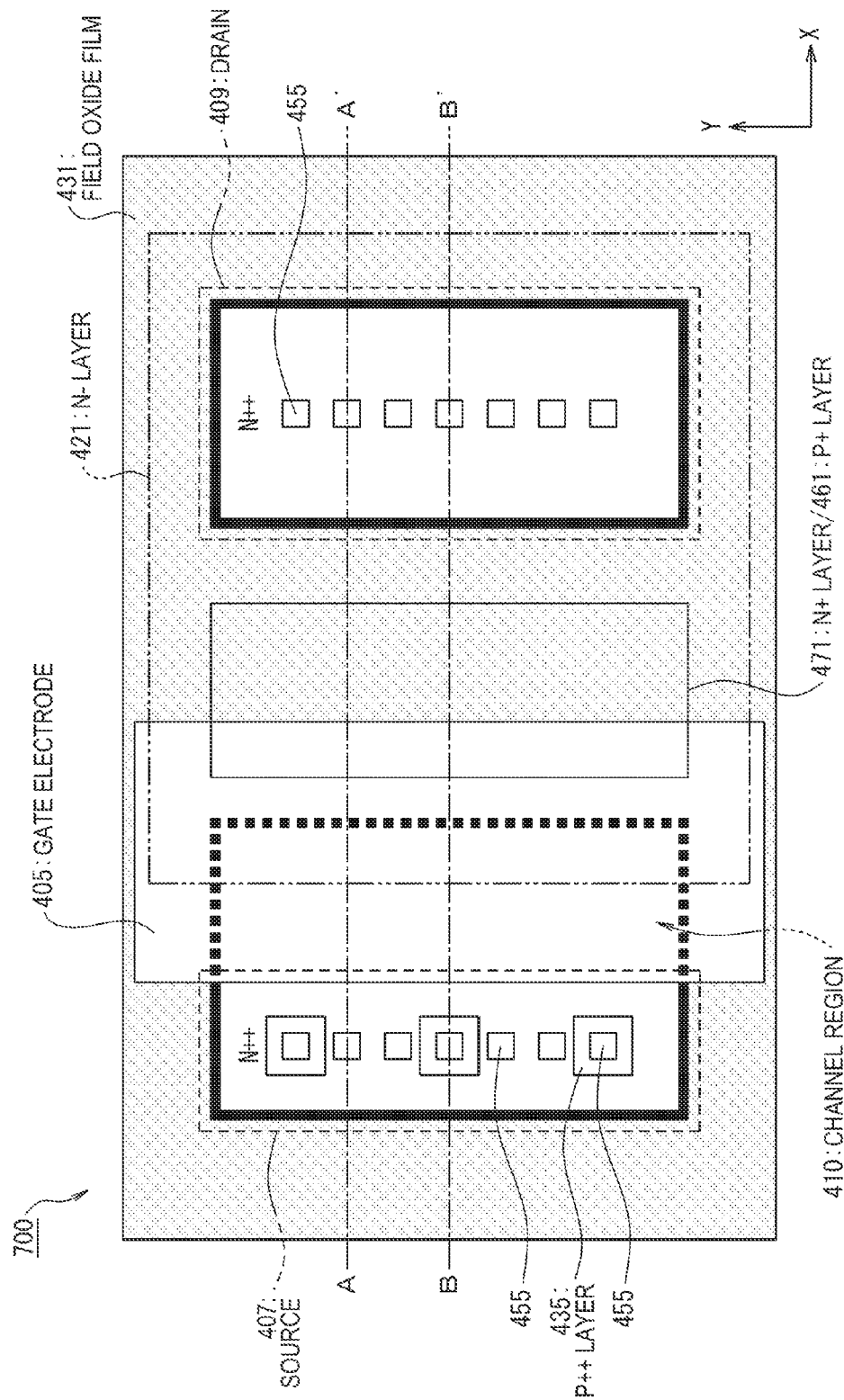
FIG. 27 is a plan view illustrating a configuration example of an LDMOS transistor 700 according to a seventh embodiment.
Figure 28:
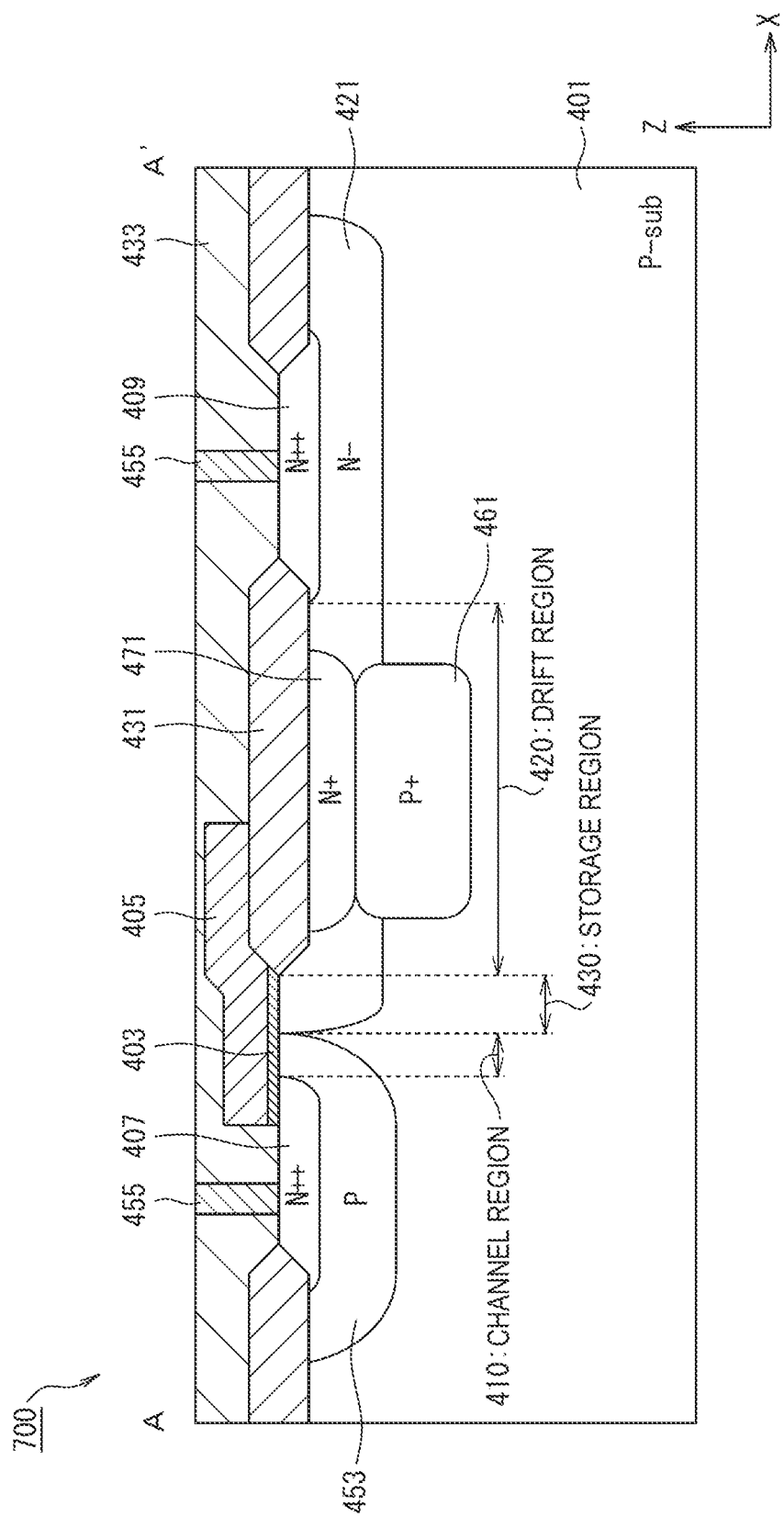
FIG. 28 is an A-A' cross-sectional view illustrating a configuration example of the LDMOS transistor 700.
Figure 29:
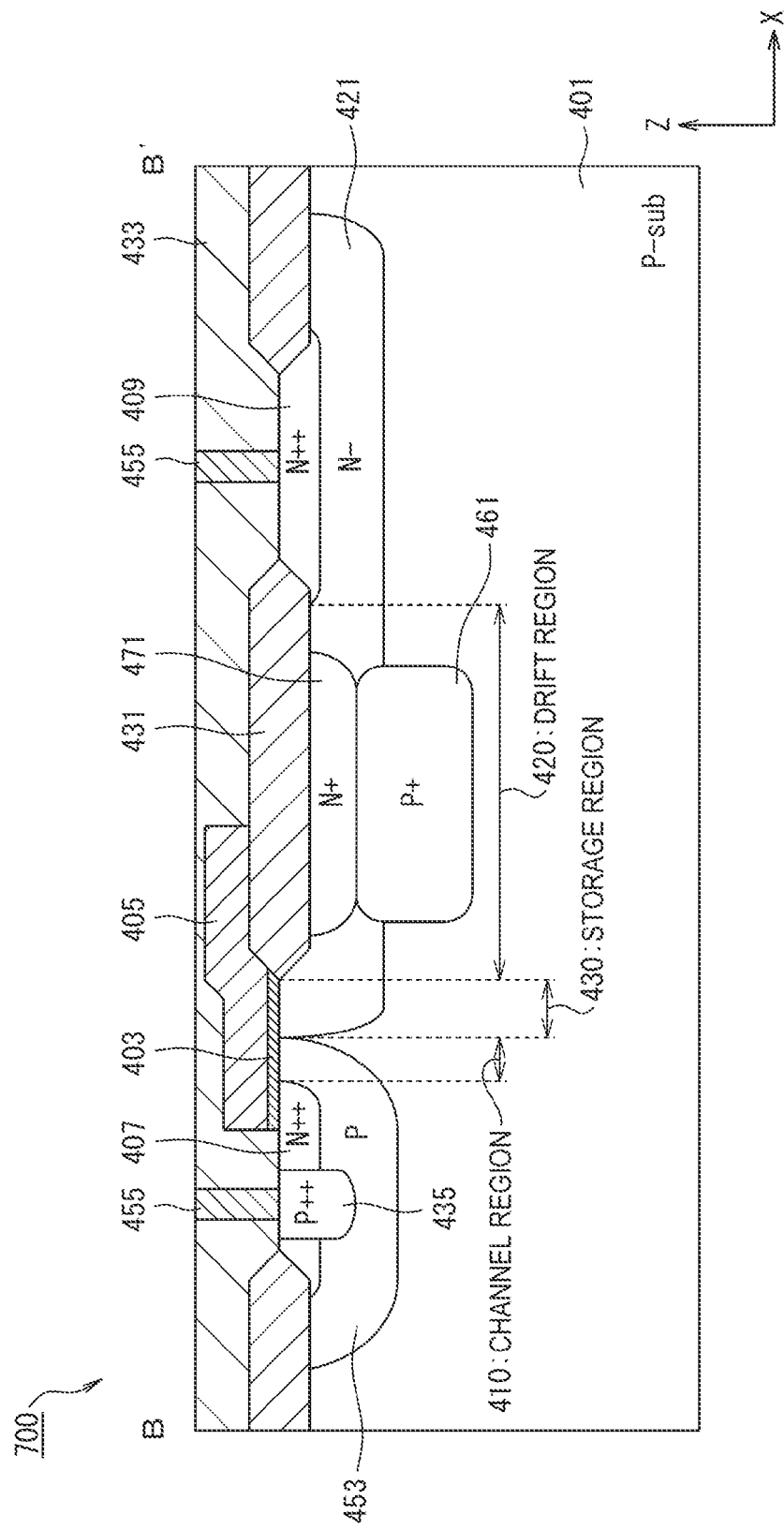
FIG. 29 is a B-B' cross-sectional view illustrating a configuration example of the LDMOS transistor 700.
Figure 30:
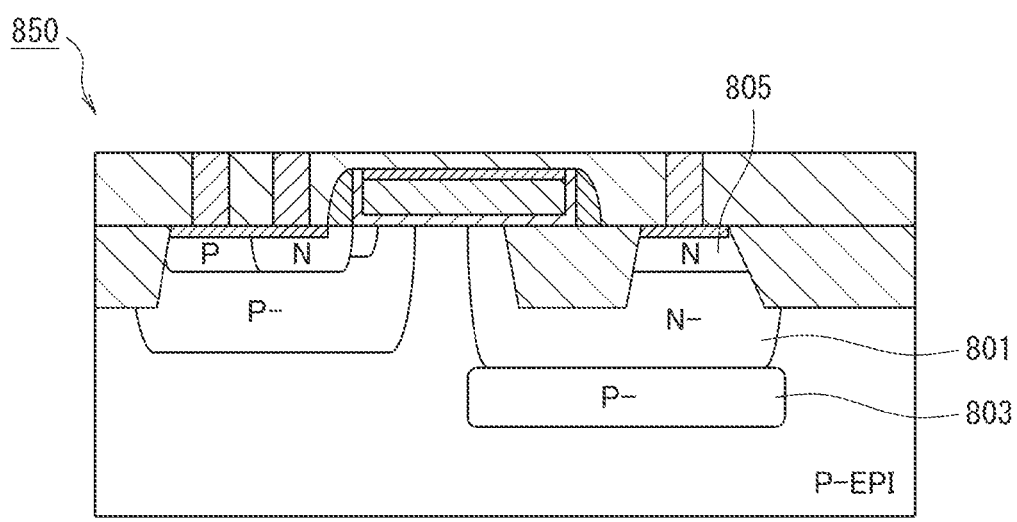
FIG. 30 is a view illustrating a configuration example of an LDMOS transistor 850 according to a conventional example.

FIG. 27 is a plan view illustrating a configuration example of an LDMOS transistor 700 according to the seventh embodiment. Further, FIG. 28 and FIG. 29 are respectively an A-A' cross-sectional view and a B-B' cross-sectional view illustrating the configuration example of the LDMOS transistor 700. It is to be noted that the illustration of an interlayer insulating film is omitted in FIG. 27 to avoid complication of the drawing.

As illustrated in FIG. 27 to FIG. 29, a structural difference between this LDMOS transistor 700 and the LDMOS transistor 600 described in the sixth embodiment resides in that the P layer 451 and the N layer 423 are omitted. The LDMOS transistor 600 and the LDMOS transistor 700 are the same in terms of configurations other than it.

Effects of Seventh Embodiment

The seventh embodiment of the present invention brings about the following effects in addition to the effect corresponding to the effect (4) of the fifth embodiment.

(1) The P+ layer 461 having a higher P-type impurity concentration than the P-type silicon substrate 401 is disposed beneath the drift region 420. Thus, the RESURF effect can be obtained and OFF-BVdss can be maintained high.

(2) Also, since the RESURF effect can be obtained, it is possible to increase an N-type impurity concentration near the surface of the drift region 420 as in the N+ layer 471. Thus, it is possible to increase OFF-BVdss and reduce the on-resistance. Trade-off characteristics of the drain breakdown voltage and the on-resistance can be improved.

(3) Further, the N+ layer 471 having a higher N-type impurity concentration than the N− layer 421 is disposed on the P+ layer 461. Thus, it is possible to suppress a net charge in the depletion layer of the drift region 420 from changing from plus (+) to minus (−) under the influence of the drain voltage and the P+ layer 461 when the LDMOS transistor 700 is being turned on. It is possible to suppress the occurrence of the Kirk effect around the drain 409. Thus, it is possible to prevent an electric field from being concentrated on the end portion of the drain 409 and maintain ON-BVdss high.

(Modification)

The modifications (3) to (5) described in the first embodiment, the modifications (2) and (3) of the fifth embodiment, and the modification (1) of the sixth embodiment may be applied to the seventh embodiment.

(Measuring Method)

In the present embodiment, SCM (Scanning Capacitance Microscopy) or the like is given as a method of observing a cross section of a field effect transistor. This method is intended to scan a semiconductor surface subjected to cross-section processing using a probe given conductive coating, measure a variation in capacitance correlated to a carrier concentration, and two-dimensionally visualize a carrier distribution.

[Others]

The present invention is not intended to be limited to the respective embodiments described above. Design changes or the like may be added to the respective embodiments on the basis of the knowledge of those skilled in the art. Forms added with such changes or the like are included in the scope of the present invention.

REFERENCE SIGNS LIST

1: silicon substrate
3: gate insulating film
5: gate electrode
7: source
9: drain
10: channel region
11, 15: silicon oxide film
12, 13, 16: resist pattern
14: trench
20: drift region
21: (first) drift layer
22: second drift layer
23: third drift layer
30: storage region
31, 131: field oxide film
33: interlayer insulating film
35: pickup layer
50, 150, 250, 350: LDMOS transistor
51: embedded layer
53: body layer
55: contact electrode
57: wiring layer
61: protective film
100, 200, 300, 400: semiconductor device
120, 220: drift layer 401: silicon substrate
403: gate insulating film
405: gate electrode
407: source (N++ layer)
409: drain (N++ layer)
410: channel region
420: drift region
421: N− layer
423: N layer
430: storage region
431: field oxide film
433: interlayer insulating film
435: P++ layer
451: P layer (P-type embedded layer)
453: P-body layer
455: contact electrode
461: P+ layer
471: N+ layer
500, 600, 700: LDMOS transistor.

The invention claimed is:

1. A field effect transistor comprising:
a drift region of a first conductivity type disposed between a region to be a channel of a semiconductor substrate and a drain of a first conductivity type;
a field oxide film disposed on the drift region; and
a first impurity diffusion layer of a second conductivity type disposed beneath the drift region of the semiconductor substrate,
wherein the drift region includes a first drift layer of a first conductivity type, and a second drift layer, disposed on the first drift layer, having a higher first conductivity type impurity concentration than the first drift layer.

2. The field effect transistor according to claim 1, further including a second impurity diffusion layer, disposed beneath the drift region, having a higher second conductivity type impurity concentration than the first impurity diffusion layer,
wherein the drift region further includes a third drift layer, disposed on the second impurity diffusion layer, having a higher first conductivity type impurity concentration than the second drift layer, and
wherein the third drift layer and the second impurity diffusion layer are located directly below the field oxide film.

3. The field effect transistor according to claim 2, wherein the third drift layer is in contact with the field oxide film.

4. The field effect transistor according to claim 1, wherein the second drift layer extends from below an end portion of the field oxide film to the region side to be the channel.

5. A field effect transistor comprising:
a drift region of a first conductivity type disposed between a region to be a channel of a semiconductor substrate and a drain of a first conductivity type;
a field oxide film disposed on the drift region; and
a second impurity diffusion layer of a second conductivity type disposed beneath the drift region of the semiconductor substrate,
wherein the drift region includes a first drift layer of a first conductivity type, and a third drift layer disposed on the second impurity diffusion layer, having a higher first conductivity type impurity concentration than the first drift layer, and
wherein the third drift layer and the second impurity diffusion layer are located directly below the field oxide film.

6. A field effect transistor comprising:
a source and a drain formed in a semiconductor substrate;
a field oxide film formed on the semiconductor substrate;
a drift layer of a first conductivity type formed beneath the field oxide film and formed between a lower layer of the drain and the drain and a channel region;
a first region being below the drain and in contact with the bottom of the drift layer, having a second conductivity type different from the first conductivity type; and
a second region having a second conductivity type, which is in contact with the bottom of the drift layer except in the first region,
wherein a second conductivity type impurity concentration of the first region is lower than a second conductivity type impurity concentration of the second region.

7. The field effect transistor according to claim 6, wherein the drift layer includes a first drift layer, and a second drift layer, disposed on the first drift layer, having a higher first conductivity type impurity concentration than the first drift layer.

8. The field effect transistor according to claim 7, wherein the drift layer further includes a third drift layer disposed on the first drift layer, having a higher first conductivity type impurity concentration than the second drift layer,
wherein the third drift layer is disposed beneath the field oxide film.

9. The field effect transistor according to claim 7, wherein the second drift layer extends from below an end portion of the field oxide film to the region side to be the channel.

10. The field effect transistor according to claim 6, wherein the second conductivity type impurity concentration of the first region is the same impurity concentration as the semiconductor substrate.

11. A field effect transistor comprising:
a source and a drain formed in a semiconductor substrate;
a field oxide film formed on the semiconductor substrate;
a body layer of a second conductivity type formed from beneath the source to a channel region;
a drift layer of a first conductivity type formed beneath the field oxide film, formed beneath the drain, and formed between the drain and the channel region;
an impurity diffusion layer of a second conductivity type disposed below the field oxide film in the drift layer except for below at least a part of the drain; and
a second impurity diffusion layer of a second conductivity type disposed below at least a part of the drain,
wherein a second conductivity type impurity concentration of the second impurity diffusion layer is lower than a second conductivity type impurity concentration of the impurity diffusion layer.

12. A field effect transistor comprising:
a source and a drain formed in a semiconductor substrate;
a field oxide film formed on the semiconductor substrate;
a body layer of a second conductivity type formed from beneath the source to a channel region;
a drift layer of a first conductivity type formed beneath the field oxide film, formed beneath the drain, and formed between the drain and the channel region;
an impurity diffusion layer of a second conductivity type disposed below the field oxide film in the drift layer except for below at least a part of the drain; and
a second drift layer of a first conductivity type disposed between the drain and the impurity diffusion layer,
wherein a first conductivity type impurity concentration of the second drift layer is higher than a first conductivity type impurity concentration of the drift layer.

* * * * *